United States Patent [19]

Staiger

[11] Patent Number: 4,648,042
[45] Date of Patent: Mar. 3, 1987

[54] METHOD OF AND ARRANGEMENT FOR GENERATING PULSES OF AN ARBITRARY TIME RELATION DURING IMMEDIATELY SUCCESSIVE ASSUMED PULSE INTERVALS WITH A VERY HIGH ACCURACY AND TIME RESOLUTION

[75] Inventor: Dieter E. Staiger, Wealem Schoenbuch, Fed. Rep. of Germany

[73] Assignee: International Business Machines Corporation, Armonk, N.Y.

[21] Appl. No.: 616,637

[22] Filed: Jun. 4, 1984

[30] Foreign Application Priority Data

Jun. 8, 1983 [EP] European Pat. Off. ........ 83105616.3

[51] Int. Cl.[4] .......................... G06F 3/14; G06F 15/34
[52] U.S. Cl. ..................................... 364/486; 364/521
[58] Field of Search ....................... 364/486, 518, 521; 382/48; 340/723, 750, 709, 706

[56] References Cited

U.S. PATENT DOCUMENTS

| 4,027,148 | 5/1977 | Rosenthal | 364/521 X |
| 4,074,359 | 2/1978 | Hasenbalg | 364/521 |
| 4,146,925 | 3/1979 | Green et al. | 364/521 |
| 4,188,627 | 2/1980 | Alexander et al. | 364/521 X |
| 4,205,389 | 5/1980 | Heartz | 364/521 X |
| 4,330,834 | 5/1982 | Murphy | 364/521 |
| 4,365,305 | 12/1982 | MacDonald et al. | 364/521 |
| 4,396,989 | 8/1983 | Fleming et al. | 364/521 |
| 4,434,503 | 2/1984 | Tanaka et al. | 364/518 X |
| 4,481,594 | 11/1984 | Staggs et al. | 364/521 |
| 4,481,605 | 11/1984 | Chase | 364/521 X |

Primary Examiner—Edward J. Wise
Attorney, Agent, or Firm—Francis J. Thornton

[57] ABSTRACT

The present invention is directed to a method of and and apparatus for continuously generating desired pulses during assumed successive desired pulse intervals with a very high time resolution by digitally predetermining the time values related to the start of the desired pulse intervals. These time values are divided into coarse and fine time rasters and coarse pulse intervals are generated from the assumed desired pulse intervals. The coarse pulses in the coarse time raster are generated from the desired pulses and each coarse pulse start and coarse pulse end, respectively is associated with a coarse pulse correction value. By adding the coarse pulse interval correction value to the coarse pulse correction value for the start and the end of the coarse pulse, respectively, a sum correction value is obtained and divided into a partial value associated with the fine time raster. The partial value of the sum correction value is used as a control value for a selected time delay for the coarse pulse edge shifted.

10 Claims, 24 Drawing Figures

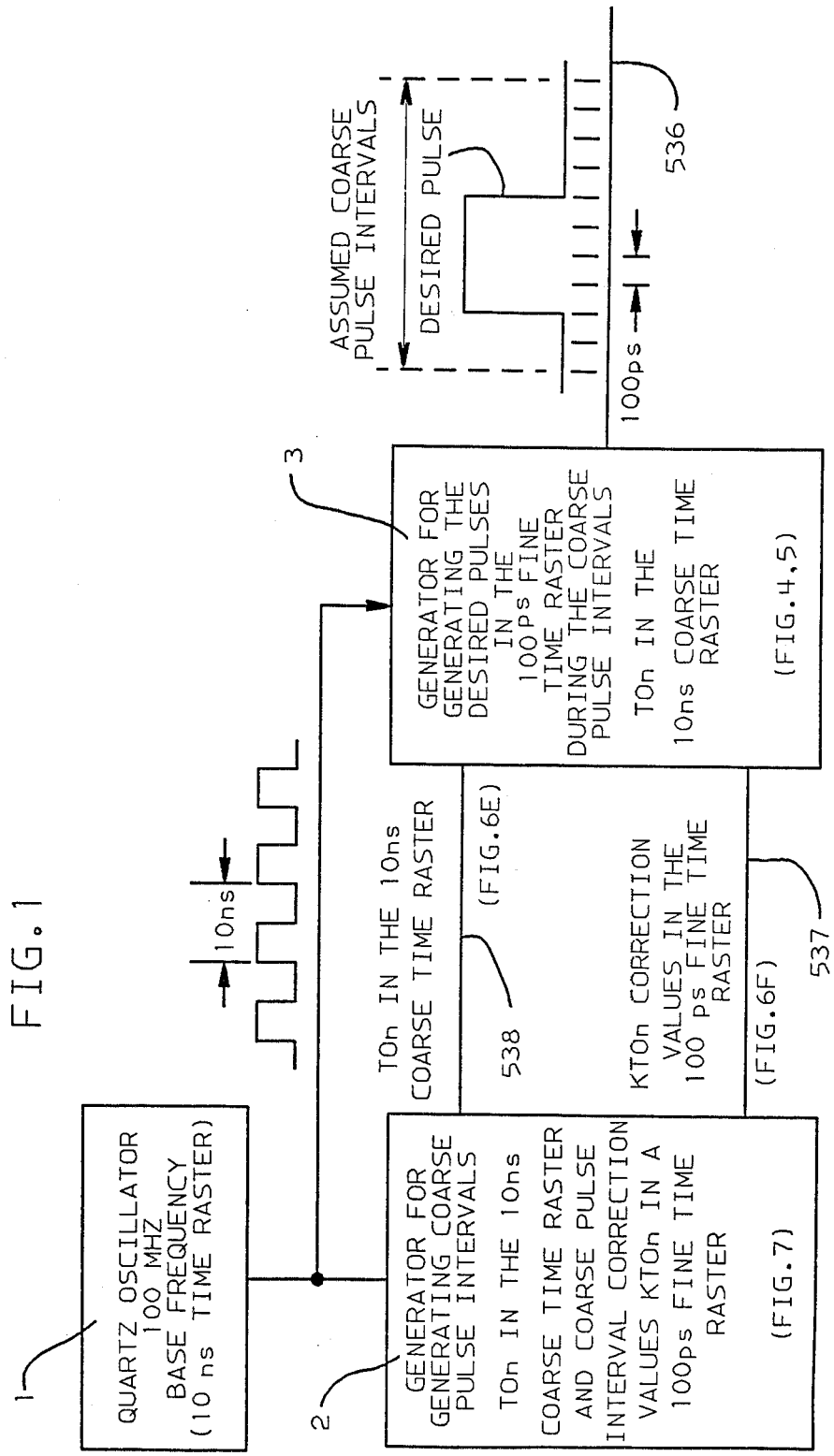

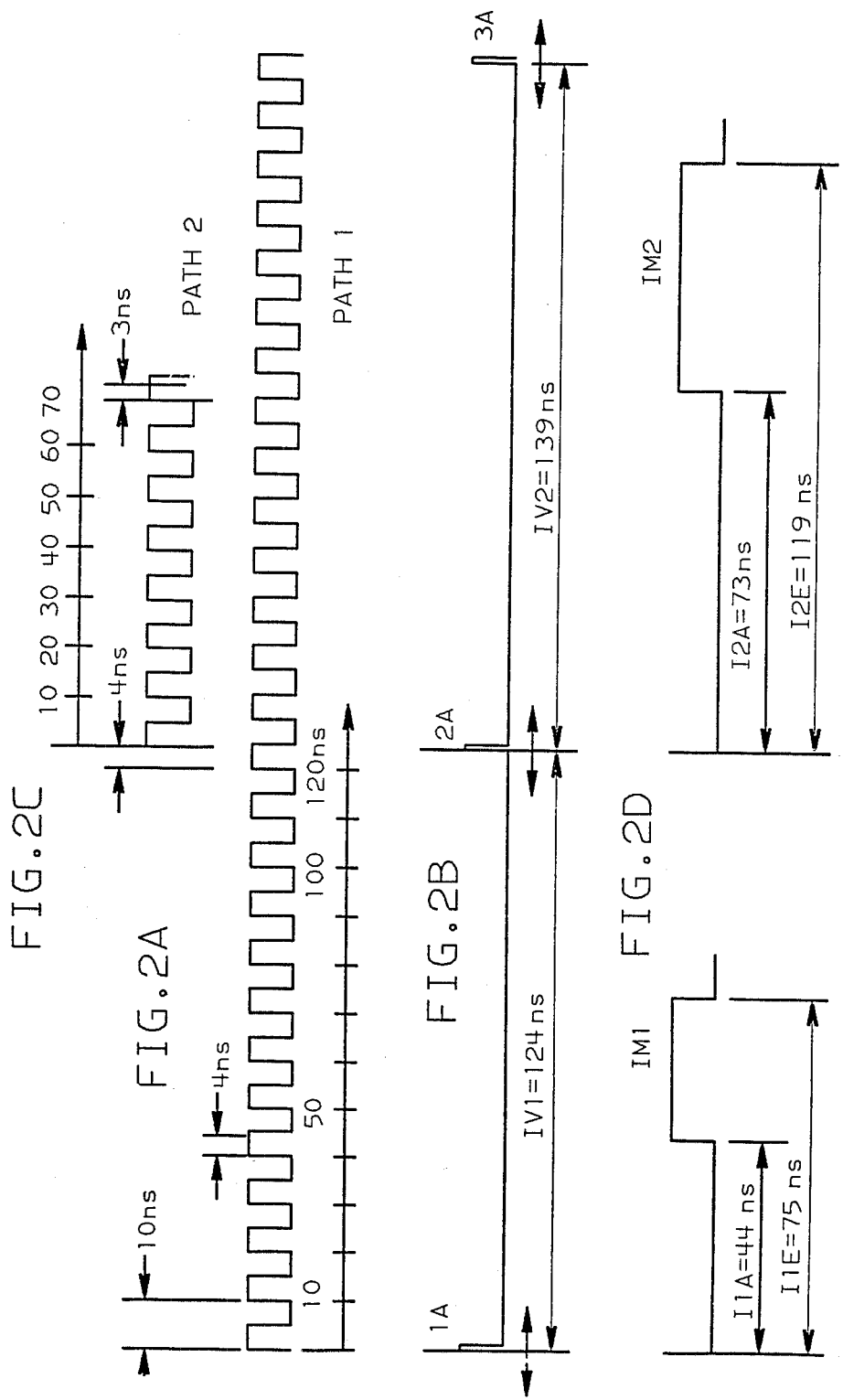

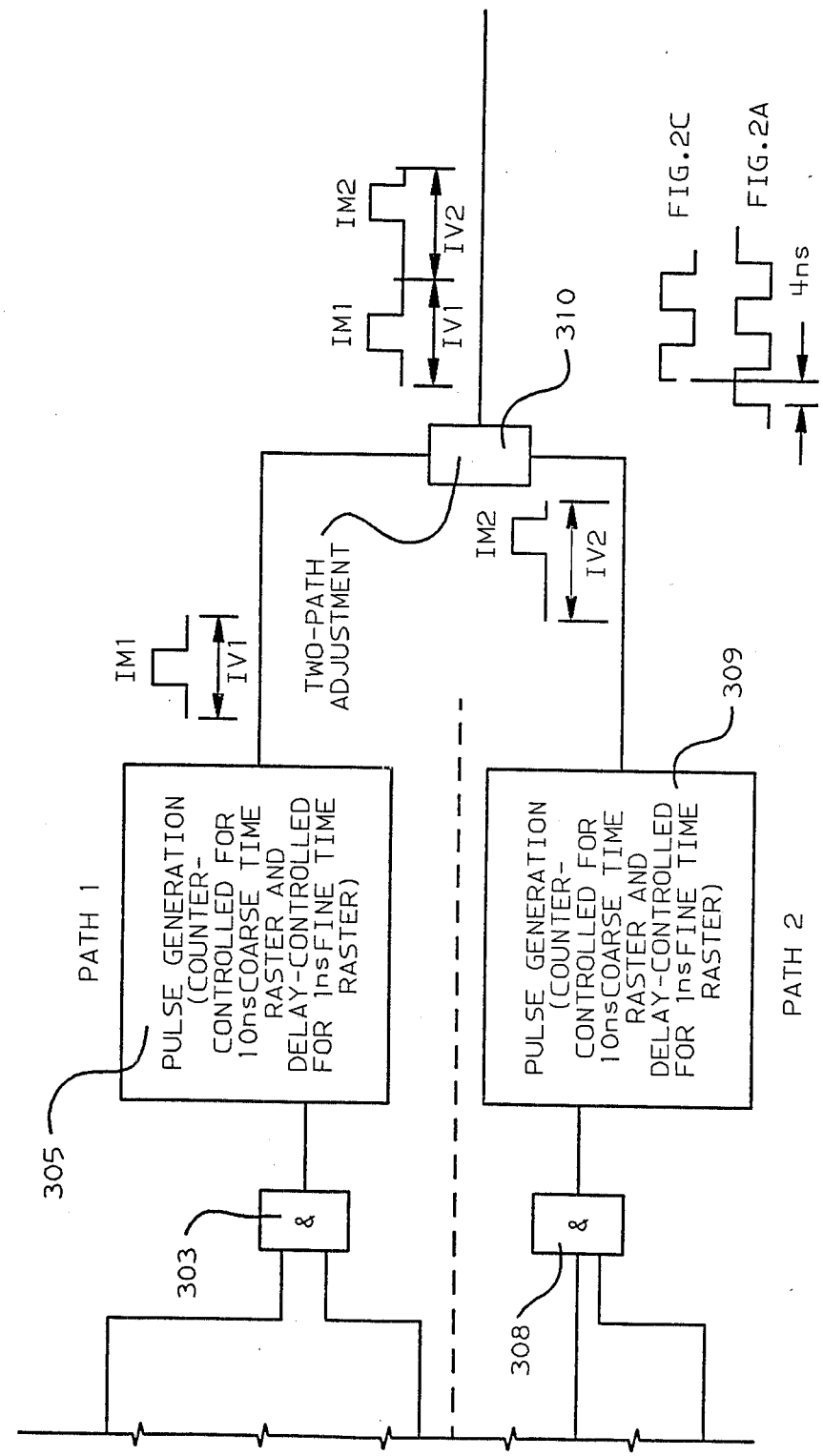

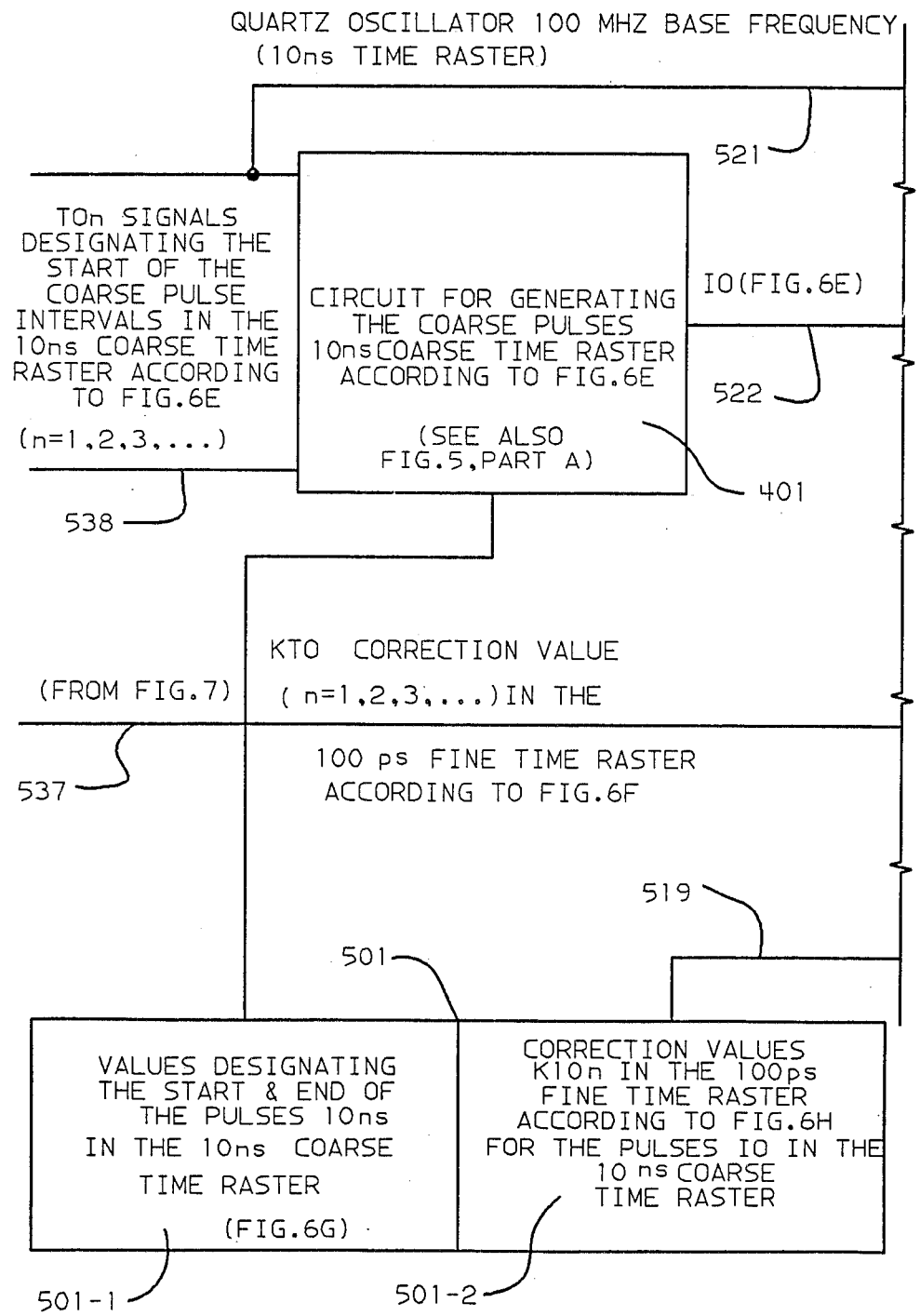

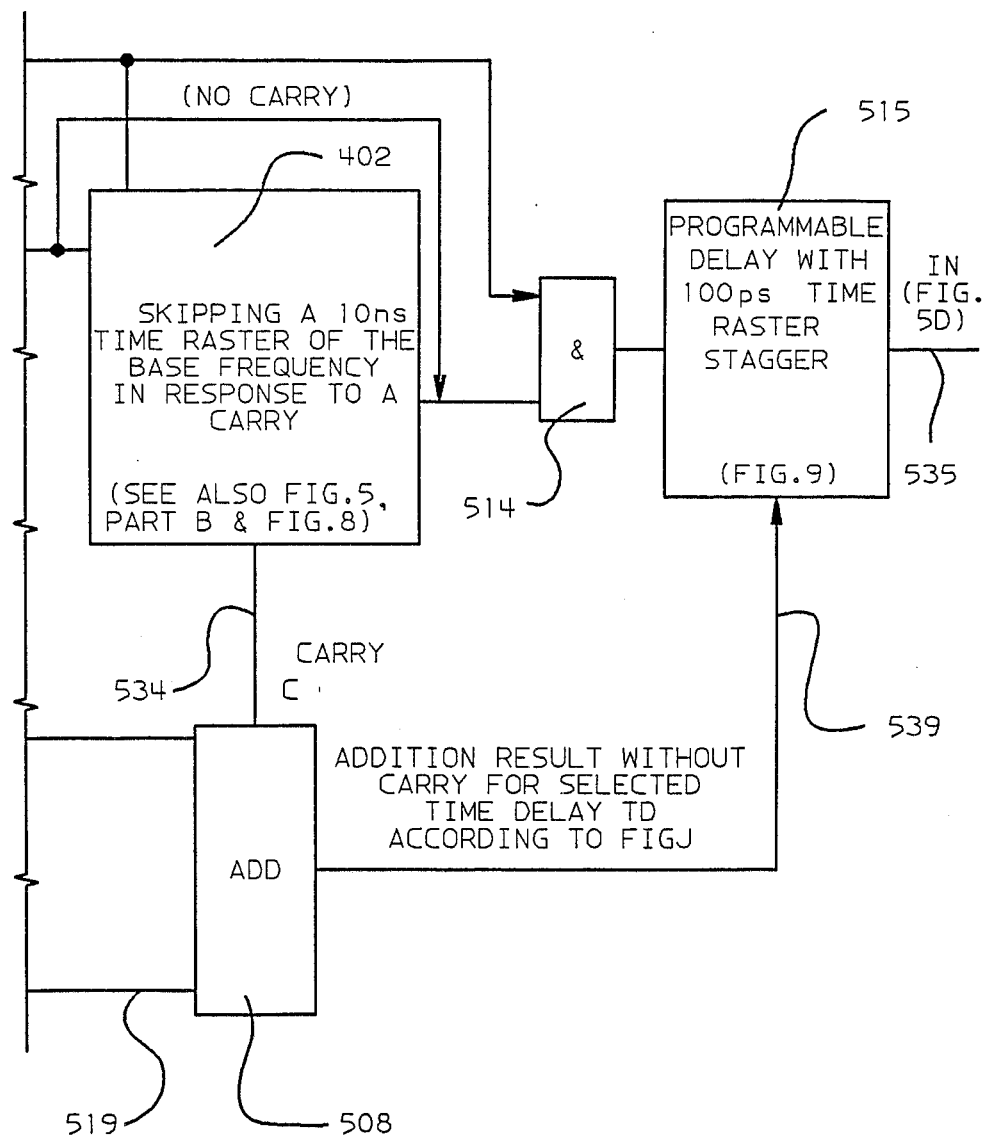

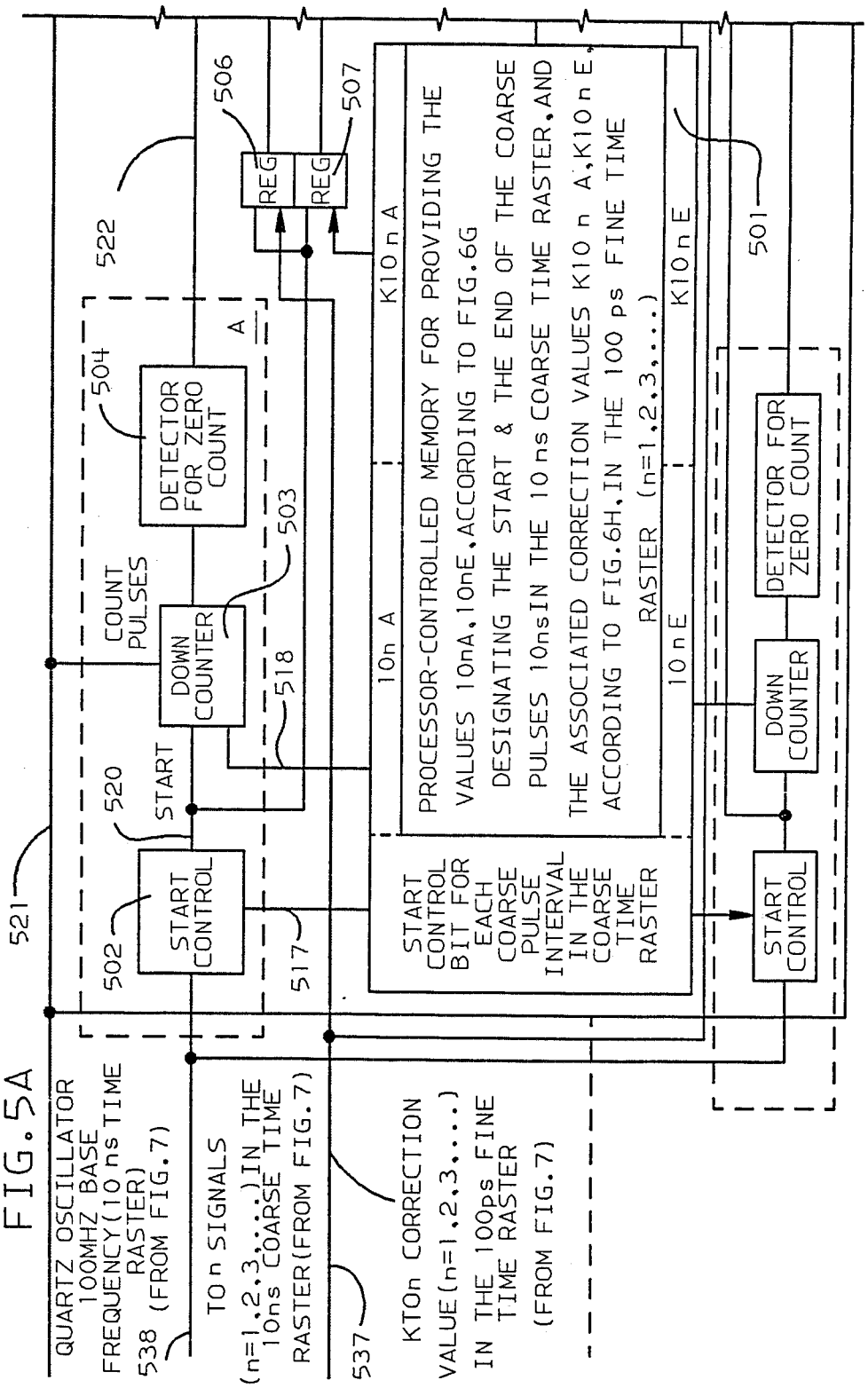

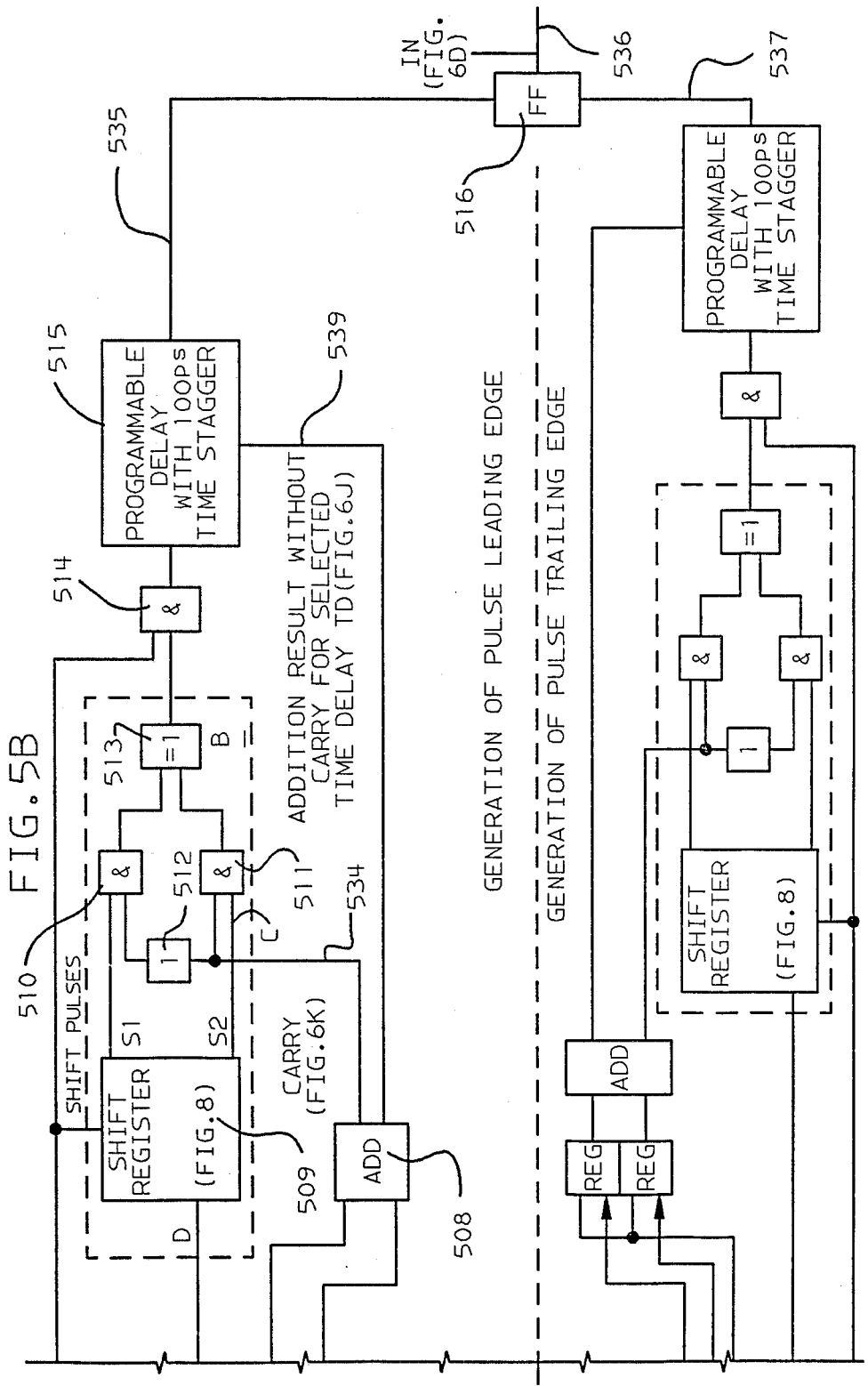

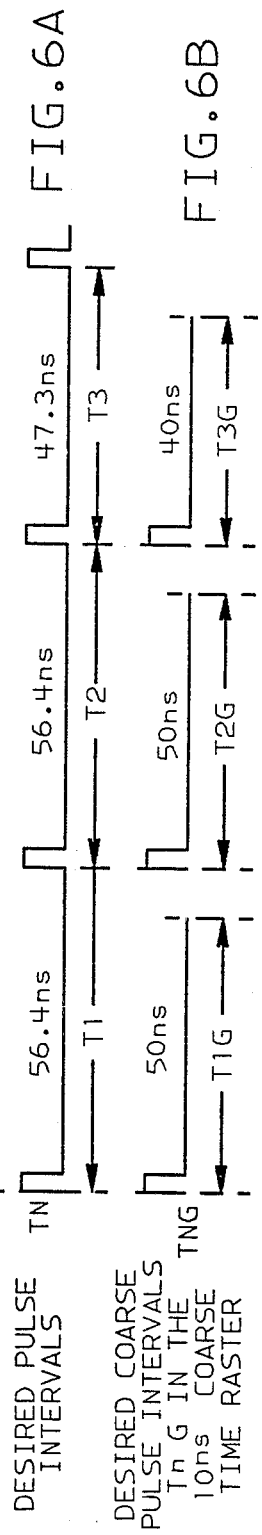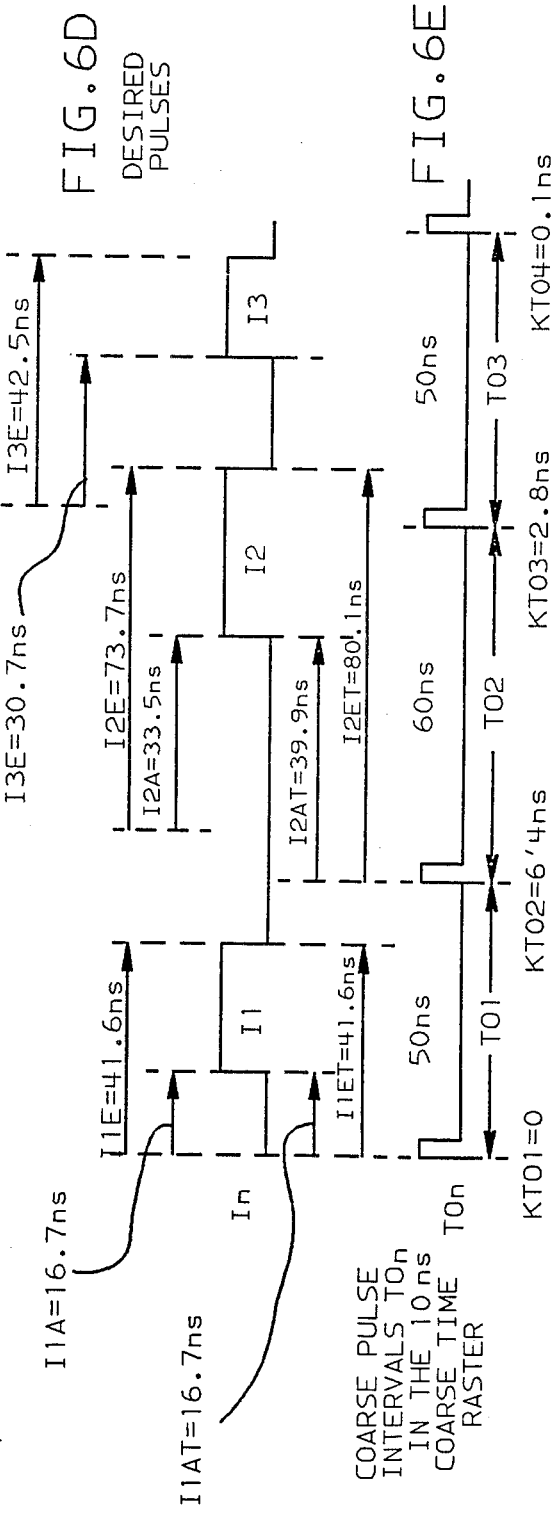

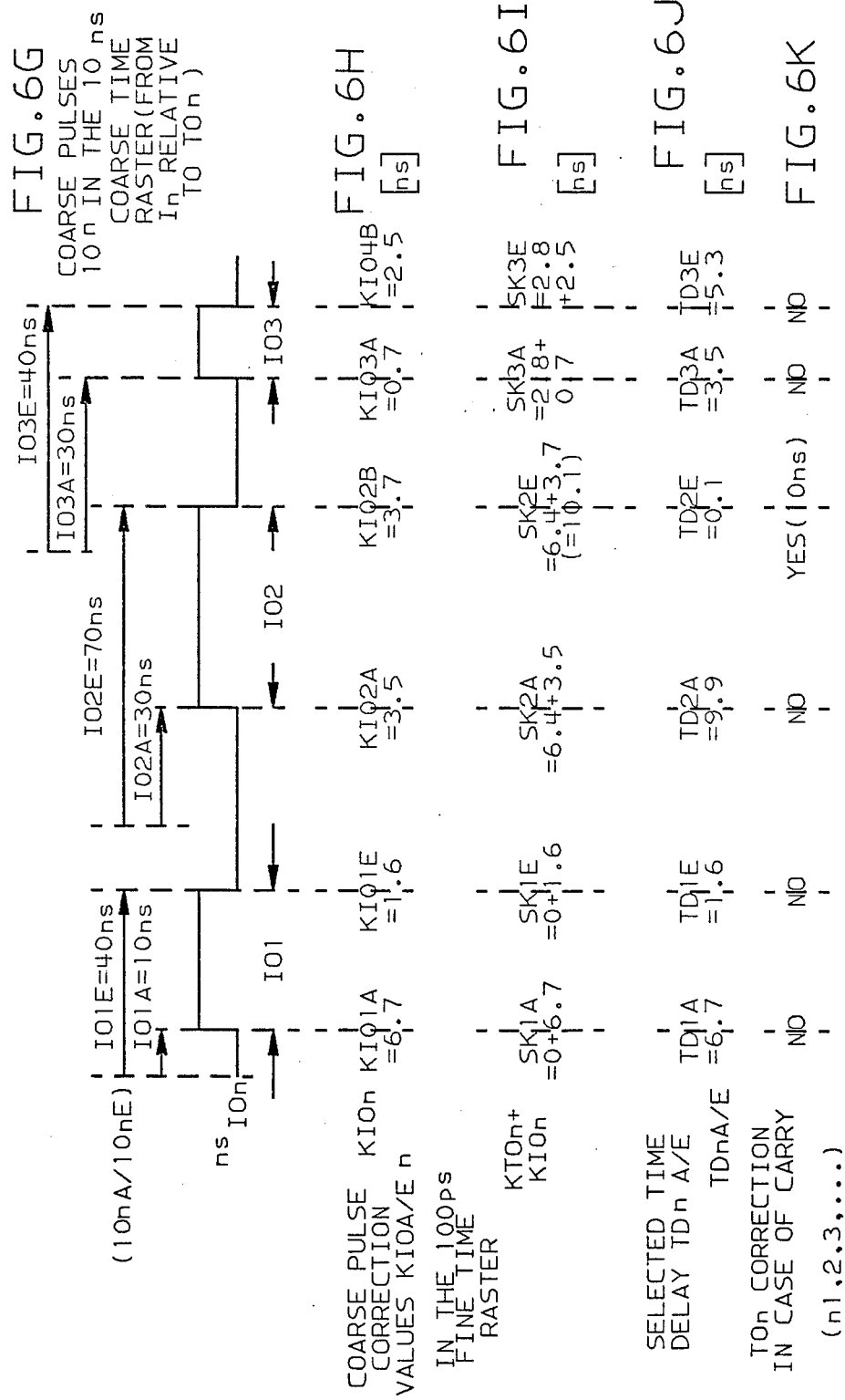

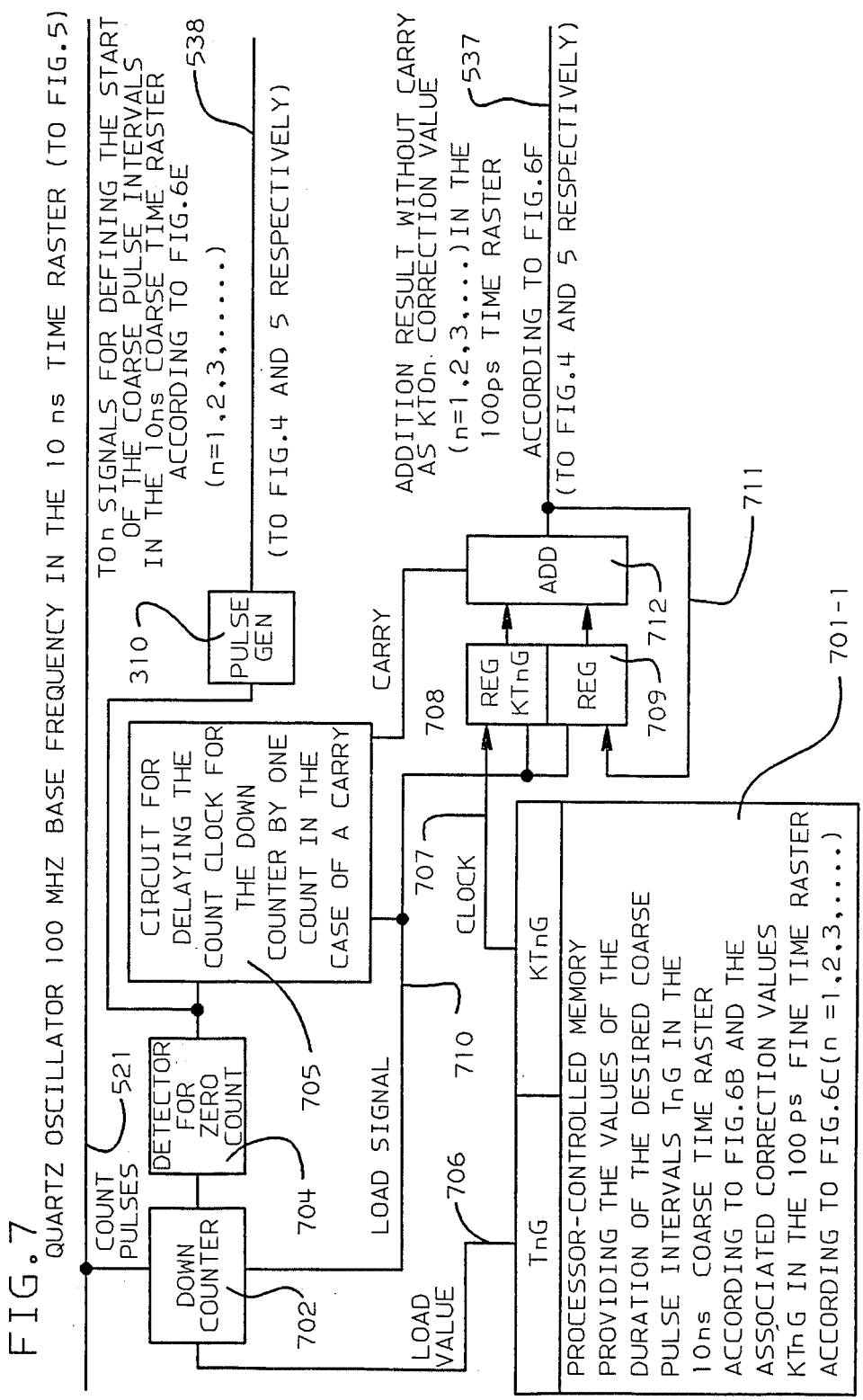

METHOD OF AND ARRANGEMENT FOR GENERATING PULSES OF AN ARBITRARY TIME RELATION DURING IMMEDIATELY SUCCESSIVE ASSUMED PULSE INTERVALS WITH A VERY HIGH ACCURACY AND TIME RESOLUTION

BACKGROUND OF THE INVENTION

1. Field of the Invention

The invention concerns a method of and an arrangement for generating pulses of a predetermined time relation during given pulse intervals with a very high time resolution.

2. Description of the Prior Art

For testing memory products, a suitable pulse pattern is applied and the behavior of the memory product in response to such pulse patterns is recorded and compared with theoretical desired values. This comparison provides data on whether the memory product operates as required or on whether there are any defects.

The pulse train to be generated is initially predetermined in theory by the specifications for the memory product and is generated using a pulse generator.

In detail it is pointed out that optimum testing should take into account that an event, attributable to the respective product to be tested, may make it necessary to replace one pulse train by another. This means, upon the occurrence of such an event, the original pulse train has to be replaced by a new one. Switching from one pulse train to another requires time. For technical reasons prior art systems could not be switched without delays, and a new pulse train could be introduced only after transients had decayed during which time the conditions in the product to be tested might have changed.

To eliminate this waiting period U.S. Pat. No. 4,203,543 (German Offenlegungsschrift No. 27 46 743) provided a method of and an arrangement for generating immediately successive pulse trains, characterized in that before a particular count is reached, the down counter is loaded with a new initial count from memory, loading being effected at a time at which the down counter would have reached a zero count.

A 100 MHz oscillator with a 10-nanosecond (ns) time raster driving the arrangement for implementing this method, permitted the generation of pulses of a predetermined time relation (with a 1 ns time raster) during given pulse intervals with a 10 ns time raster. However, this 10 ns time raster was insufficient for testing fast memory products.

To test such fast memory products, U.S. Pat. No. 4,263,669 (German Offenlegungsschrift No. 28 29 709) provided a method of generating immediately successive pulse cycles, wherein before a particular count is reached, the down counter is loaded with a new initial count from memory, loading being effected at a time at which the down counter would have reached a zero count. This method is characterized in that the start of a count step of the down counter is delayed by integral multiples of the count clock, and that a pulse is subjected to a delay with a high time resolution to provide a cycle start pulse.

The arrangement described in this U.S. Pat. No. 4,263,669 also permits pulse intervals in the 1 ns time raster. However, as a result of the circuits used, the start of a new pulse interval invariably had to coincide with the start of a 10 ns time raster derived from a quartz oscillator. Therefore, idle time of about 20 ns, which occurred either before the start of a pulse to be newly generated or after the decay of a pulse previously generated up to the start of the subsequent pulse interval, had to be tolerated.

The reason for this was that the 1 ns delay values for the pulses to be generated had to be loaded into the respective counters only at times at which no pulses were generated or at which a pulse previously generated had decayed.

Thus, it was not possible to successively generate pulse intervals with a 1 ns time resolution.

U.S. Pat. No. 4,389,614 (German Offenlegungsschrift No. 30 23 699) avoided such idle times by permitting the successive generation of pulse intervals and pulses having a high time resolution. Using known circuit technologies and the circuit speeds they afford, this patent taught that pulse intervals and pulses could be generated with a time resolution of 1 ns. In this prior art, the signals designating the start and the end of a pulse interval were generated by an oscillator for coarse raster time values and a delay circuit with selectively addressable delay taps. The signals designating the pulse intervals were alternately applied to one of two paths such that the signal designating the start of the respective pulse interval coincided with the coarse time raster provided by the oscillator. For each path, the leading and the trailing edge of a pulse to be generated during a pulse interval were derived from oscillator clock driven counters which are loaded with a new count from memory when a particular count is reached. The counters for generating the leading and trailing edges were connected to one common delay circuit each with memory-controlled, selectively addressable delay taps and delay taps for a fine time raster, respectively. The pulse data generated on both paths were merged on a common line.

The circuit according to U.S. Pat. No. 4,389,614 thus permitted the generation of pulse intervals with a resolution of 1 ns.

However, switching between taps of the delay line involved waiting periods which prevented the generation of immediately successive pulse intervals. These waiting periods can be large for two reasons; first, when switching from one delay line tap to another it may happen, for example, that a dropping voltage is stopped from dropping and is initially forced to rise. In such a case, there is an additional waiting time until a new edge suitable for counting is available at the new delay line tap; and second, when known fine delay lines with taps staggered by 100 picoseconds (ps) are used an additional waiting period will be incurred by switching the 10 ns base frequency. As these fine delay lines consist of LC devices, which when series-connected do not reach the frequency and the characteristic impedance stability of a coaxial cable in the LC equivalent circuit diagram, additional problems are encountered with transients.

The above-described method according to U.S. Pat. No. 4,389,614 thus requires elaborate circuit means necessary for the 2-path method. Also adjustment tolerances for the taps of the delay lines propagate through the entire system for generating the desired pulse trains, causing inaccuracies, i.e. variations of the reference points designating the start of the pulse intervals, and pulses, whose length is less than two successive pulse intervals minus waiting periods cannot be generated.

In summary it may be said that this 2-path method does not permit the generation of pulse intervals and pulses with a higher time resolution than 1 ns, even if it were possible to replace the delay lines by lines with a 100 ps time stagger. Generally, such 100 ps staggered delay line taps would be excessive and inaccuracies would propagate through the entire system, jeopardizing the time requirements for the pulse trains to be generated.

SUMMARY OF THE INVENTION

The present invention achieves these and other objects of the invention by continuously generating desired pulse intervals with a very high time resolution by digitally predetermining the time values for the duration of the desired pulse intervals and the time values related to the start of the desired pulse intervals, for the start and the end of the desired pulses, whose edges for a coarse and a fine time raster are respectively derived under counter control and as a function of a delay.

More specifically, in the present invention the time values are divided into a coarse time raster and into a fine time raster, and continuous, successive coarse pulse intervals, in the coarse time raster, together with the associated coarse pulse interval correction values in the fine time raster are generated from the assumed desired pulse intervals, such that for successive pulse intervals, the duration of the desired pulse intervals is obtained by cumulatively adding the duration of the coarse pulse interval to the associated coarse pulse interval correction value.

The coarse pulses, in the coarse time raster, together with the associated coarse pulse correction values in the fine time raster are generated from the desired pulses. The time values for the start and the end of the coarse pulses are related to their respective associated coarse pulse interval, and each coarse pulse start and coarse pulse end, respectively, is associated with a coarse pulse correction value so that by respectively adding the time value for the coarse pulse start and the coarse pulse end to the associated coarse pulse correction value, the time value, related to the start of the desired pulse interval, is respectively obtained for the start and the end of the desired pulse.

By adding the coarse pulse interval correction value to the coarse pulse correction value for the start and the end of the coarse pulse, respectively, a sum correction value is obtained and divided into a first partial value associated with the fine time raster and, if necessary, into a second partial value associated with the coarse time raster.

If the second partial value of the sum correction value is present, the coarse pulse edge is shifted by the coarse time raster corresponding to this partial value, and the first partial value of the sum correction value is used as a control value for a selected time delay for the coarse pulse edge so shifted or, in the absence of the second partial value of the sum correction value, for the unshifted coarse pulse edge.

Therefore, it is the object of the invention to provide a method of and an arrangement for generating pulse intervals with a finer time raster than was previously possible and to generate pulse trains with an equally fine raster during them. The time raster preferably envisaged is a 100 ps time raster which is finer by the factor 10 than the previous 1 ns time raster.

It is a further object of the invention to derive the pulses from a more readily usable coarse time raster, preferably 10 ns, rather than from the 1 ns time raster of a delay line with taps staggered by 1 ns, which is more complicated to handle from a circuit standpoint.

DESCRIPTION OF THE DRAWINGS

The method in accordance with the invention and the circuit required for its implementation will be described in detail below with reference to the accompanying drawings in which FIG. 1 shows a summarizing block diagram for generating pulses in a 100 ps time raster.

FIGS. 2A–2D show, according to the prior art a 10 nanosecond pulse raster, pulse intervals with a time raster, and pulses, also in a 1 nanosecond time raster, occurring during these intervals.

FIG. 4 shows a detailed representation of a circuit for generating pulses in a 100 picosecond time raster during virtual pulse intervals in the 10 nanosecond time raster according to FIG. 1.

FIGS. 5A–5B show a more detailed representation of the circuit according to FIG. 4 with reference to one circuit part for generating the leading pulse edges and another identical circuit part for generating the trailing edges of the pulses.

FIGS. 6A–6K show the time curve of pulse intervals and pulses in a fine and a coarse raster with the associated correction values.

FIG. 7 shows according to the prior art a circuit for generating virtual pulse intervals in the 10 nanosecond coarse time raster with correction values in the 100 picosecond time raster.

DETAILED DESCRIPTION OF THE INVENTION

FIG. 1 is a summarizing block diagram for generating the desired pulses in which are shown in FIG. 6D with given time relations in a 100 picosecond (ps) time raster on line 536.

A 10 nanosecond (ns) time raster is derived from a quartz oscillator 1 with a 100 MHz base frequency. This time raster is applied to a generator 2, for generating coarse pulse intervals T0n in a 10 ns coarse time raster on line 538 and correction values KT0n in a 100 ps fine time raster on line 537, and to a generator 3, for generating desired pulses in a 100 ps fine time raster during coarse pulse intervals T0n in a 10 ns coarse time raster, on line 521.

Before discussing the present invention further a brief review of U.S. Pat. No. 4,389,614 in conjunction with FIGS. 2A through 2D and FIG. 3 might be appropriate.

FIGS. 2A to 2D show, time-related to each other, a 10 ns pulse raster, pulse intervals and pulses occurring during such intervals in a 1 ns time raster.

Figure 3A:
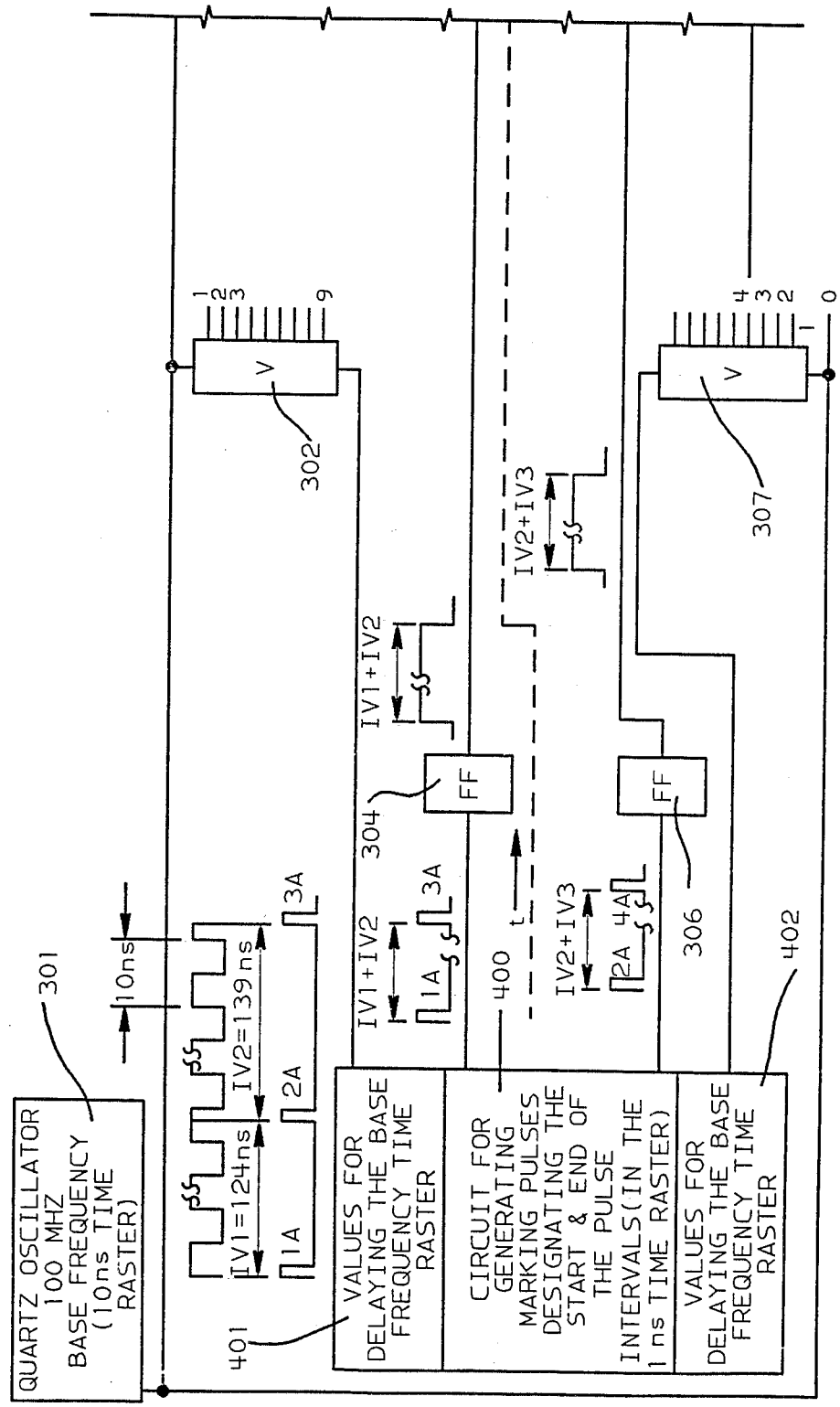
FIG. 3 shows, according to the prior art, a summarizing representation of a circuit for a so-called 2-path method for generating pulses of a given time relation during given pulse intervals with a time resolution of 1 nanosecond.

This representation, together with FIG. 3, serves to summarize the method described in U.S. Pat. No.

4,389,614 of generating without any idle times successive pulse intervals and the pulses occurring during them. The time resolution of the pulse intervals and the pulses is 1 ns and the generation of the pulse intervals is based on the 10 ns time raster of a 100 MHz quartz oscillator.

Such a 10 ns time raster, derived from a 100 MHz oscillator, is shown in FIG. 2A. This time raster is associated with a path I. As shown, for example, in FIG. 2B, pulse intervals are predetermined to have a duration of IV1=124 ns and IV2=139 ns, respectively. The start and the end of each pulse interval, respectively, is designated by a marking pulse 1A, 2A, 3A. The pulse intervals follow each other without idle times, so that the marking signal designating the end of a pulse interval simultaneously designates the start of the subsequent pulse interval. FIG. 2D shows how pulses IM1 and IM2 are predetermined during the individual pulse intervals IV1 and IV2 and time-related to the start of the marking pulse designating the respective pulse interval. Pulse I1, whose leading edge is spaced I1A=33 ns from the start of the pulse interval IV1, appears during the first pulse interval IV1.

The leading edge of IM1 is derived under counter control from four successive 10 ns time rasters (4×10 ns=40 ns) and from a delay by 4 ns (44−40=4) effected by a delay line. In this manner, quartz accuracy is maintained for the generation of the pulse edge, using the 10 ns time raster of the 100 MHz quartz oscillator as a reference value. The only inaccuracy to be tolerated is the tolerance of the delay line taps which are staggered by 1 ns.

The trailing edge of the pulse IM1 is analogously determined. In order to maintain the pulse edges, that have been predetermined under counter control and by delay, also for IM2, the start of the marking pulse 2A must coincide with the start of a 10 ns time raster. (This does not apply, however, to IV1=124). Therefore, the 10 ns time raster according to FIG. 2A is time-shifted by 4 ns and associated with a path II. In this manner it is ensured that the pulse leading edge (I2A=73 ns) of IM2 is predetermined under counter control (providing seven 10 ns time rasters plus a delay of 3 ns).

It would also be conceivable to determine the pulse edges only on the basis of an appropriate pulse delay. Apart from the circuitry required for this purpose, such a solution would have the disadvantage of the inaccuracies in the times of occurrence of the marking pulses 1A and 2A, respectively, (marked by a double arrow in FIG. 2B) propagating through the entire system. This would unacceptably and continuously interfere with the time relations of the pulses and the pulse intervals.

Therefore, in U.S. Pat. No. 4,389,614 it was proposed to synchronize the generation of the edges of pulses IM1 and IM2 with quartz accuracy, thus permitting these edges during the individual intervals to be determined with quartz accuracy under counter control. FIG. 3 shows a circuit for implementing this method. The 100 MHz oscillator 301 is used both for a circuit part referred to as path I and a circuit part referred to as path II. The indicated time data constitute only one example and refer to the time relations of the pulse intervals IV1, IV2 and the pulses IM1, IM2 in FIG. 2. The individual pulse intervals are alternately generated on path I and path II. It is assumed that pulse interval IV1 is generated on path I. For the purpose of simplicity, it is assumed further that the marking pulse 1A as the start of pulse interval IV1 coincides with the start of a 10 ns time raster. Thus, this time raster is assumed not to be delayed by the delay line 302 with taps (1 to 9) staggered by 1 ns. The 10 ns time raster sequence is fed to an AND gate 303, whose second input is conditioned for the duration (124+139 ns) of the pulse interval IV1+IV2. A circuit 400 serves to generate the start and the end of the 1 ns time raster marking pulses (1A, 2A, 3A, etc.) designating the start and the end of the pulse intervals. The pulse intervals are alternately generated on path I and path II. By means of a flip-flop circuit 304 (path I) and 306, respectively, (path II), a signal is generated from successive marking pulses, whose duration is IV1+IV2 on path I and IV2+IV3 on path II. This signal, which is present for the duration of the pulse interval IV1+IV2 (path I), is applied to AND circuit 303. In this manner, AND circuit 303 is conditioned for that time to pass a corresponding number of 10 ns time rasters. In the pulse generator circuit 305, following the AND gate 303 and which, as previously mentioned operates under counter control for the 10 ns coarse time raster and under delay line control for the 1 ns fine time raster, pulse IM1 is generated during the interval IV1. As it is known that the leading edge of the IM1 has to be generated 44 ns after the occurrence of 1A, it is merely necessary for circuit 305 (which is described in detail in U.S. Pat. No. 4,389,614) to effect a counter-controlled comparison for four 10 ns time rasters and a delay of 4 ns. Accordingly, the end of pulse IM1 is determined under counter and delay line control.

With regard to FIG. 2, it has already been mentioned that the 10 ns time raster for path II is to be delayed by, for example, 4 ns. This value, which represents the difference between the duration of the pulse interval in the 1 ns time raster and integral multiples of the 10 ns time raster, is known prior to the generation of the pulse pattern. Difference values of this kind for the individual pulse intervals, which may be alternately generated on path I and II, can thus be stored in registers 401 or 402 and be used to control the delay line 303 or 307 (for path II).

For pulse interval IV2 (path II), this value is 4 ns, as previously mentioned. By means of this control value, the respective tap of delay line 307 is activated, so that a phase shift of 4 ns (as required according to FIG. 2C) is obtained for the 10 ns time raster.

The function of the circuit for path II is analogous to that for path I. This 2-path method necessitates that the start of a marking pulse initiating the pulse interval coincides with a 10 ns time raster. Waiting periods, as have to be tolerated when only one delay line (only one path) is used, are avoided with the 2-path method. These waiting periods are attributable to the occurrence of so-called transients. A waiting period includes the time that would be required for obtaining a 10 ns time raster start if the taps of only one delay line were switched.

In accordance with this, there would be a waiting period (transient) of almost one period for the 10 ns time raster of the quartz oscillator. The present invention avoids this.

Before discussing the circuitry of the present invention, the pulses provided thereby will be described in conjunction with FIGS. 6A thru 6K which show, the time curve of pulse intervals and pulses occurring during them. These are based on the same time scale and are adapted to each other so that it is possible to provide correction values for particular times at which pulse intervals and pulses are represented in a coarse time raster. This permits the inventive principle and the function of the circuit for implementing the present invention to be more readily appreciated.

The quantitative time data in FIGS. 6A to 6K refer to values which can be easily achieved by means of electronic components presently available. For faster components, to the extent to which these are currently available, the time data would have to be modified accordingly. In other words, given the availability of faster electronic components, the teaching of the invention, described with reference to an embodiment concerning a 100 ps time raster, may also be applied to finer time rasters.

FIG. 6A shows three immediately successive desired pulse intervals Tn (T1, T2, T3). These pulse intervals are assumed to occur between the leading edges of two successive marking pulses. All desired pulse intervals are based on a 100 ps time raster, i.e., the duration of each desired pulse interval may be integral multiples of 100 ps. The first and the second desired pulse intervals T1, T2 and T3 each have a duration of 56.4 ns, whereas the third interval T3 has a duration of 47.3 ns. The duration of the individual desired pulse intervals is arbitrarily determined.

The desired pulse T, T2 and T3 of FIG. 6A, are subdivided, according to FIG. 6B, into 10 ns coarse time pulse intervals T1G, T2G, T3G each associated with a desired coarse pulse interval correction value KT1G, KT2G, KT3G.

Thus, the desired pulse interval T1=56.4 ns shown in FIG. 6A is composed of a desired coarse pulse interval T1G=50 ns shown in FIG. 6B and the desired coarse pulse interval correction value KT1G=6.4 ns. (The desired pulse interval T1 is equal to the sum of T1G+KT1G=50+6.4=56.4 ns).

FIG. 6D shows desired pulses I, I2, I3 whose occurrence is related to the individual desired pulse intervals. Thus, it is assumed that the desired pulse I1 starts I1A=16.7 ns after the start of pulse interval T1 and ends I1E=41.6 ns after the start of pulse interval T1. Similarly the start and the end of pulse I2 are time-related to the start of the desired pulse interval T2. The desired pulse I2 is assumed to start 33.5 ns after the start of pulse interval T2 and end 73.7 ns after the start of pulse interval T2. Also the desired pulse I3 starts 30.7 ns after the beginning of pulse interval T3 and ends 42.5 ns after the start of T3.

The duration of such a pulse may extend into one of the subsequent desired pulse intervals, for example, pulse I2 starts in the desired pulse interval T2 and ends during the desired pulse interval T3.

The pulse train shown in FIG. 6D constitutes but one example of such time relations.

On the basis of this data successive desired coarse pulse intervals T01, T02, T03 are generated in a 10 ns coarse time raster (FIG. 6E) and the associated coarse pulse correction value KT02, K203 and K204 are generated in a 100 ps line raster.

In this manner, the 56.4 ns desired pulse interval T1 of FIG. 6A is converted into a coarse pulse interval T01 of only 50 ns of FIG. 6E. As, in actual fact, the desired pulse interval T1 is not terminated after 50 ns (T01), but instead a correction value KT02=56.4−50=64 ns is added to the end of the coarse pulse interval T01, in order for it to equal the duration of the desired pulse interval T1.

The duration of 60 ns of the coarse pulse interval T02 is obtained as follows: The correction value KT02=6.4 ns (end of T01) is added to the duration of the desired pulse interval T2 of 56.4 ns. The resultant sum 56.4+6.4=62.8 ns is reduced in the 10 ns time raster (FIG. 3E) to a time of 60 ns for T02. The remaining correction value KT03, to be considered at the end of T02, is 62.8−60=2.8 ns.

This is similar for pulse T03. The correction value KT03=2.8 ns (at the end of T02) is added to the duration of 47.3 ns of the desired pulse interval T3. Of the resultant 47.3+2.8=50.1 ns, 50 ns are for the coarse time raster of T03 and 50.1−50=0.1 ns for the correction value KT04.

The coarse pulses I01, I02, I03 of FIG. 6G in the coarse time raster to be derived from the desired pulses I1, I2, I3 of FIG. 6D are related to the coarse pulse intervals T01, T02, T03 of FIG. 6E. If the desired pulse T1 of FIG. 6D, starts at 16.7 ns after the start of the desired pulse interval T01 of FIG. 6E, then the coarse pulse I01 of FIG. 6G must start at I01A, i.e., 10 ns after the start of pulse T01. The difference of 6.7 ns is taken into account by a correction value KI01A of FIG. 6H. As pulse I1 of FIG. 6D ends at I1ET 41.6 ns after the start of T01 (FIG. 6E), coarse pulse I01 of FIG. 6G must end after 40 ns (I01E) FIG. 6G. Thus, the correction value KI01E (FIG. 6H) for the end of coarse pulse I01 (FIG. 6G) is 1.6 ns. Pulse I02 in FIG. 6G is determined as follows: The desired pulse I2 (FIG. 6D) starts at I2A 33.5 ns after the start of the desired pulse interval T2. Of this value, 30 ns are for the coarse time raster and 3.5 ns for the correction value KI02A FIG. 6H associated with the start of pulse I02 (FIG. 6G). The start of pulse I02 is related to the start of the coarse pulse interval T02, even if the start of the latter interval does not coincide with the desired pulse interval T2. The correction value KT02 FIG. 6F of 6.4 ns, which equals the time difference between the start of the two pulse intervals T2, FIG. 6A, and T02, FIG. 6E, has already been taken into account at the end of T01 FIG. 6E. Analogous considerations apply to the end of the coarse pulse I02. As will be seen from FIG. 6D, pulse I2 ends at I2E 73.7 ns after the start of the desired pulse interval T2 of FIG. 6A. This 73.7 ns value is subdivided into I02E=70 ns for the coarse time raster in FIG. 6G and a correction value KI02B of 3.7 ns (FIG. 6H) for the end of pulse I02. In this manner, pulse I02 starts 30 ns and ends 70 ns after the start of the coarse pulse interval T02 (FIG. 6E).

The coarse pulse I03 (FIG. 6G) is analogously determined: As pulse I3 (FIG. 6D) starts at I3A, 30.7 ns after the start of the desired pulse interval T3, this value is subdivided into I03A=30 ns (FIG. 6G) and a correction value KI03A of 30.7−30=0.7 ns (FIG. 6H) for the pulse start. Pulse I03 ends at I03E=after 40 ns and is subject to a correction value KI04B of 2.5 ns (FIG. 6H).

In this manner, coarse pulse intervals T01, T02, T03 in the coarse time raster (FIG. 6E) with the associated correction values KT02, KT03, KT04 (FIG. 6F) are generated from the desired pulse intervals T1, T2, T3, in FIG. 6A.

On the other hand, the desired pulses I1, I2, I3 of FIG. 6D are converted into coarse pulses I01, I02, I03 (FIG. 6G) with the relevant correction values shown in FIG. 6H.

The correction value SK1E for the end of the coarse pulse I01 is obtained by summing the correction value KI01E (=1.6 ns—FIG. 6H—) and the correction value KT01 (=0 ns) for the start of the coarse pulse interval T01. Analogously, the sum correction value SK2A for the start of the coarse pulse I02 is obtained by summing the correction value KI02A (=3.5 ns) and the correction value KT02 (=6.4 ns) for the start of the coarse pulse interval T02.

The sum correction value SK2E for the end of the coarse pulse I02 is obtained by summing the correction value KI02B (=3.7 ns) for the end of I02 and the correction value KT02 (=6.4 ns) for the start of the coarse pulse interval T02. The correction values SK3A and SK3E for the coarse pulse I03 are generated accordingly.

Thus, for generating the sum correction values SKnA/E, the correction values KI0n for the coarse pulses I01, I02, I03 are in each case added to the correction values of the coarse pulse intervals T01, T02, T03 associated with them I01, I02, I03.

This addition may yield a tens carry, as occurs, for example, during the formation of the sum correction value SK2E=6.4+3.7=10.1 ns. In such a case, the tens carry will be considered in a special manner later on.

All sum correction values of FIG. 6I are provided as selected time delay values TD1A=6.7 ns; TD1E=1.6 ns, TD2A=9.9 ns, TD2E=0.1 ns as shown in FIG. 6J relative to the start and the end of the coarse pulse without taking into account a tens carry. A tens carry occurring during the formation of the sum correction value (e.g., during the formation of the value SK2E) is taken into account in FIG. 6K. This figure shows the correction necessary for this carry at the time of its occurrence, so that the carry is considered in addition to the selected time delays of FIG. 6J. In the described embodiment, the tens carry corresponds to a value of 10 ns.

It is obvious that the desired pulses I1, I2, I3 of FIG. 6D may be generated from the values of the selected time delays of FIG. 6J and that the T0n correction, in the case of a tens carry (FIG. 6K), may be effected on the basis of the coarse pulses I0, I02, I03 of FIG. 6G.

I1A=16.7 ns (FIG. 6D), for example, may be formed from the sum of I01A=10 ns and TD1A=6.7 ns.

The other values are obtained as follows:

I1E=I01E (=40 ns)+TD1E (=1.6 ns)=41.6 ns. For determining the start and end values for I2 (FIG. 6D), the time at which T02 is known to start is used as a reference value. From this time onwards, the value TD2A=9.9 ns is added to I02A=30 ns, thus yielding I2AT=39.9 ns. This value I2AT marks the start of the pulse I2 (FIG. 6D) but relative to the start of the coarse pulse interval T02.

A test will show that this calculation is correct: Pulse I2, as related to the start of the pulse interval T01 (and T1, respectively), starts after 56.4 ns (FIG. 6A)+33.5 ns (=at I2A, FIG. 6D)=89.9 ns. The starting time of the coarse pulse interval T02 is 50 ns. When the start of pulse I2 is related to this value of 50 ns, then pulse I2 starts 89.9−50=39.9 ns after the start of T02.

As previously mentioned, this value of 39.9 ns is obtained by adding 30 ns (I02A) to 9.9 ns (TD2A) (30+9.9=39.9).

For determining the time value for the end of I2 relative to the start of the desired pulse interval T02, the following calculation is made: 70 ns (I02E)+0.1 ns (TD2E)+ 10 ns (resulting from the tens carry that occurred when the sum correction value SK2E was formed), i.e., 70+0.1+10=80.1 ns.

The correctness of this may be verified as follows: If the end of I2 is related to the start of T01, then the value of 80.1 ns is to be added to the duration of T01=50 ns, value I2E=73.7 ns is added to the duration of T1=56.4 ns. In this case, too, the result is 130.1 ns.

Analogous calculations are necessary for generating the start and end values of pulse I3 from the values I03A and I03E in conjunction with the selected time delay values TD3A and TD3B. In this case, there will be no tens carries.

In summary, it may be said that the time data for the start and the end of the desired pulses I1, I2, I3 of FIG. 6D relative to the start of the associated desired pulse intervals in the coarse time raster are generated as follows:

I1AT=I01A+TD1A+tens carry
I1ET=I01E+TD1E+tens carry
I2AT=I02A+TD2A+tens carry
I2AE=I02E+TD2E+tens carry.

It is pointed out that the calculated values relate to the start of the coarse pulse intervals T01, T02, T03 of FIG. 6E and not to the start of the desired pulse intervals T1, T2, T3 of FIG. 6A.

Only the values I1A=I1AT and I1E=I1ET concur, as the start of the desired pulse interval T1 coincides with the start of the coarse pulse interval T01.

Generating the data for the desired pulses I1, I2, I3 from the values I01A, I01E, I02A, I02E, I03A and I03E of FIG. 6G, the selected time delay values of FIG. 6J and the tens carries of FIG. 6K is unproblematical, since the time values for the coarse pulse intervals T01, T02, and T03 of FIG. 6E are known. Thus, in each case, the start of the desired pulses shown in FIG. 6D may be related to the start of the coarse pulse intervals of FIG. 6E.

FIG. 7 shows in detail the generator 2 of FIG. 1 which is used for generating coarse pulse intervals such as shown in FIG. 6F and the generation of correction values. Therefore, the subsequent description refers only to those details of this circuit which are essential to render the present invention readily understandable. It is pointed out that, in conjunction with the present invention, the circuit shown in FIG. 7 serves to (a) generate from digital time values, defining the duration of the coarse pulse intervals in a 10 ns coarse time raster according to FIG. 6C and (b) provide as a digital value, in a 100 ps fine time raster only, the correction values of FIG. 6F for these coarse time raster values of the coarse pulse intervals.

A memory 701-1 successively provides, under processor control, the coarse pulse interval values TnG (FIG. 6B) and the correction values KTnG (FIG. 6C) for each coarse pulse interval in the coarse time raster. The TnG value is loaded on a line 706 into a down counter 702 which is down-counted as a function of the base frequency on line 521 provided by quartz oscillator 1 of FIG. 1. After a O-count has been reached, a signal, denoting the start or the end of a coarse pulse interval in the coarse pulse interval in the coarse time raster, is emitted by a count zero detector 704. In the circuit element 310, this signal is used to generate a pulse for the desired T0n signal on line 538: Upon the occurrence of a carry during an addition process to be described further on, circuit 705 delays the count clock of the down counter by one count. However, upon the occurrence of the TnG value on line 706, the correction value KTnG for the associated coarse pulse interval is assumed to be available on line 707. This KTnG value is loaded into register 708 from where it is fed to an adder 712. The second input of this adder is connected to a register 709 in which the value 0 is assumed to be stored at that time. By means of adder 712, the contents of registers 708 and 709 are added and the resultant sum (without considering a tens carry, if any) is emitted on line 537 as a KT0n correction value in the 100 ps fine raster according to FIG. 6F. Upon the occurrence of a T0n signal on line 538, the associated KT0n correction value is emitted on line 537.

On line 711, the addition result is fed to register 709 to be considered for the subsequent coarse pulse interval. A tens carry, if any, occurring at the adder 712 is fed to circuit 705. In response to a tens carry, this circuit comprising a counter causes the load process of the down counter 702 to be delayed via line 710 by one count (10 ns) for the subsequent coarse pulse interval. The two registers 708 and 709 are clocked by line 710. Thus, the circuit illustrated in FIG. 7 serves to provide coarse pulse intervals according to FIG. 6E on line 538 and the relevant correction values according to FIG. 6F on line 537.

The generator 3 of FIG. 1 is the basic element of the invention. For the purpose of clarity, this generator will be described with reference to FIGS. 4, 5, 6, 8, 9 and 10.

FIG. 4 is a circuit diagram for generating a pulse train in (according to FIG. 6D).

Figure 8:
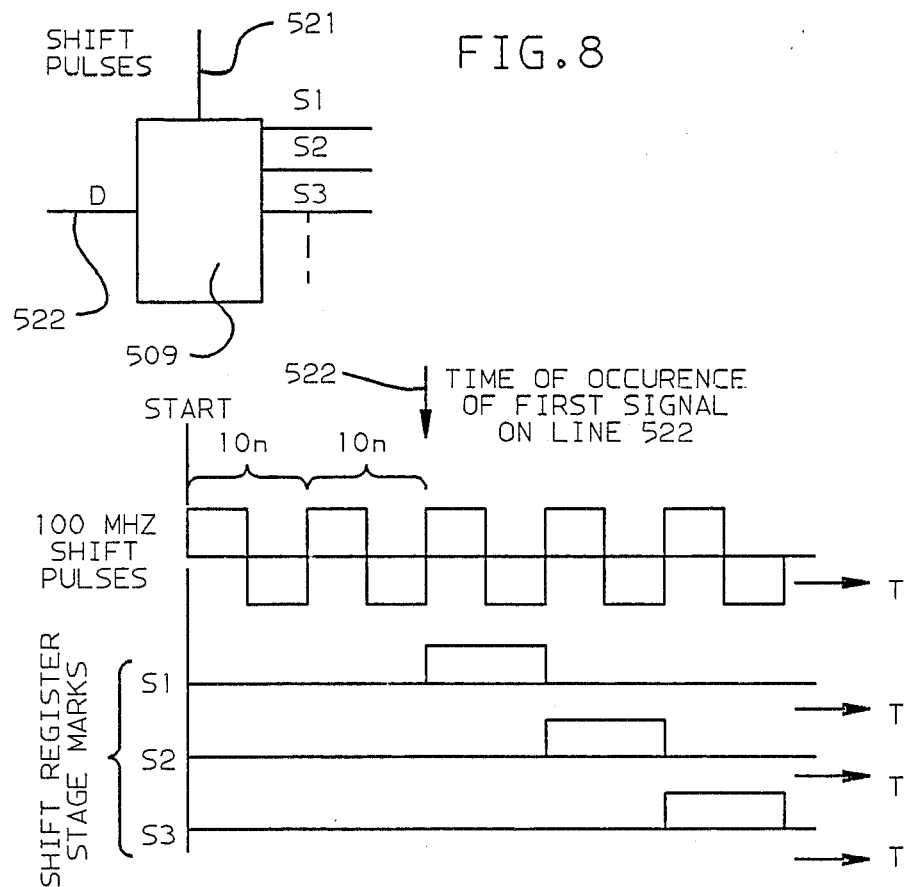
FIG. 8 shows a simplified representation of the function of the shift register in FIG. 5.

FIG. 5 is a more detailed representation of FIG. 4. FIG. 8 represents the junction of the shift register used in FIG. 5, FIG. 9 represents the selection of a delay line top, and FIG. 10 represents a controllable delay circuit.

The 100 MHz base frequency of the quartz oscillator 1 of FIG. 1 is impressed on line 521 as shown in FIG. 4. The T0n signals designating the start of the coarse pulse intervals in the 10 ns coarse time raster shown in FIG. 6E, and generated by the circuit of FIG. 7 appear on line 538. The KT0n correction values in the 100 ps fine time raster shown in FIG. 6F, which are also generated by the circuit of FIG. 7, are impressed on line 537. It is assumed further that a portion 501-1 of a processor-controlled memory 501 stores values designating the start and the end of the coarse pulses I0n of FIG. 6G in the 10 ns coarse time raster and another portion 501-2 the correction values KI0n of FIG. 6H in the 100 ps time raster. From the data on line 538 and the data in memory portion 501-1, the pulses I0n of FIG. 6G are generated by a circuit 401 on line 522 relative to the base frequency. Provided an addition step, still to be explained in greater detail, does not yield a tens carry, these pulses are fed to an AND gate 514, to whose second input the base frequency on line 521 is applied (the function of this AND gate will be described in detail in conjunction with FIG. 5). The output of this AND gate 514 is connected to a circuit 515 which permits a programmable delay with a 100 ps time raster stagger.

Figure 9:
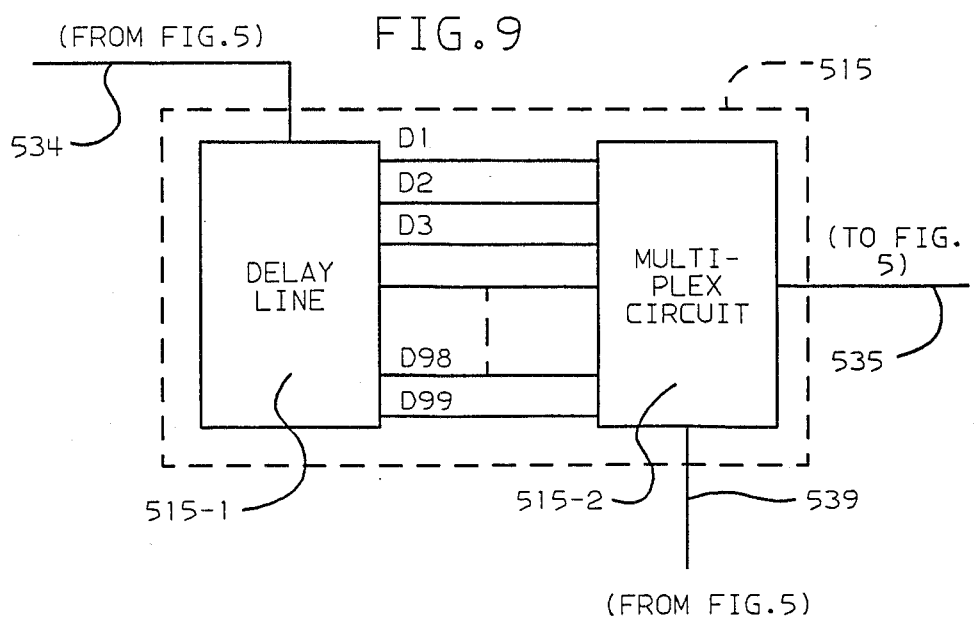
FIG. 9 shows a simplified representation of the selection of a delay line tap by predetermining the control value by means of a multiplex address circuit.
Figure 10:
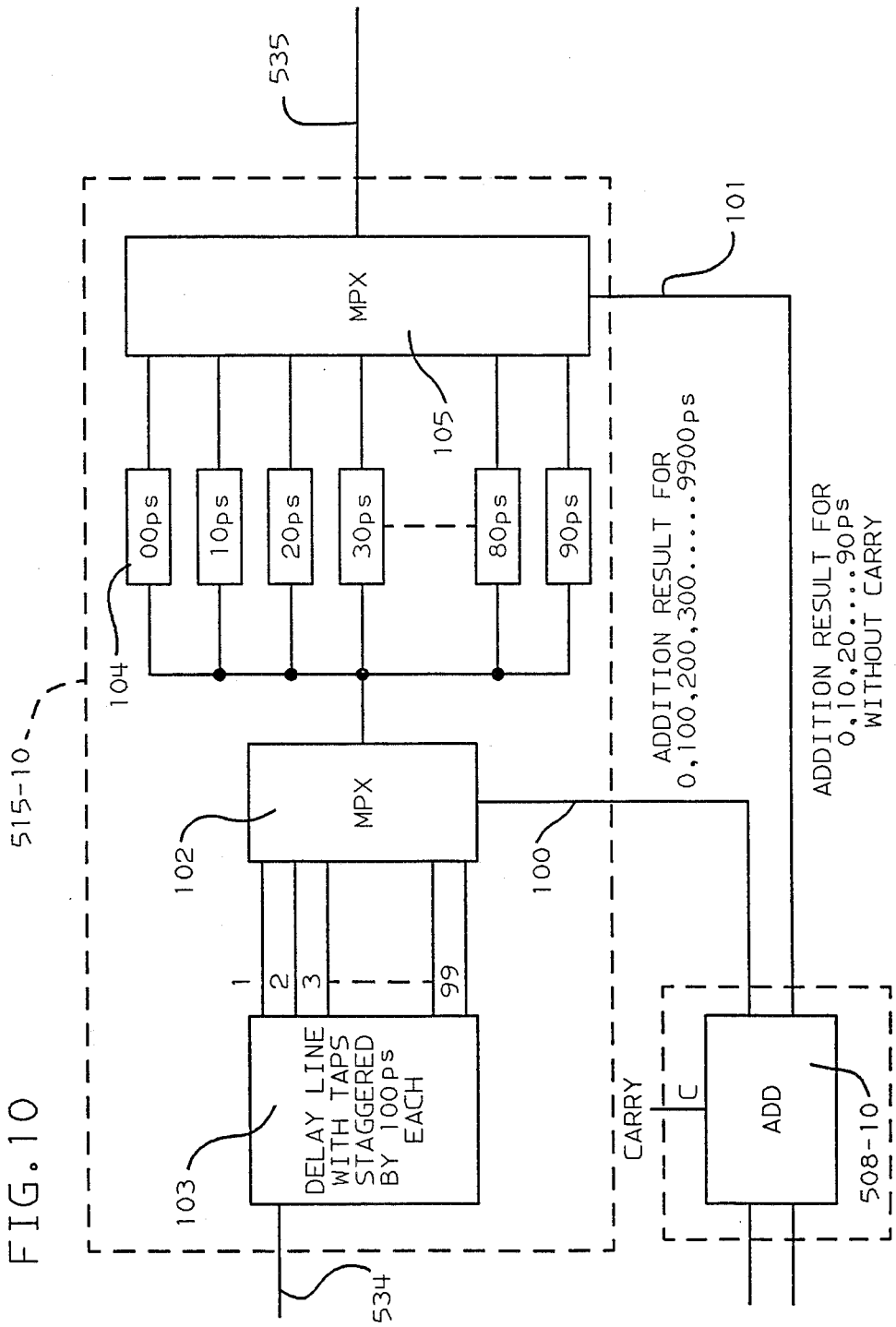
FIG. 10 shows a simplified representation of a controllable delay circuit operating in the 10 picosecond time range.

FIG. 9 shows how circuit 515 may be realized. It may suffice to point out that circuit 515 may be conceived of as a delay line whose taps are staggered by 100 ps each. Which of the taps is addressed, is determined by a control value on line 539. The desired pulse train of FIG. 6D in the 100 ps time raster is impressed, at the output of circuit 515, on line 535.

Returning again to FIG. 4 it will be described below what circuitry measures are necessary to convert the coarse pulse train I0 in the 10 ns coarse time raster into a desired pulse train of FIG. 6D in a 100 ps time raster, taking into account the correction values KI0n of FIG. 6H in memory portion 501-2. For this purpose an adder 508 with two inputs 537 and 519 is provided. As previously mentioned, input 537 emits the KT0n correction values of FIG. 6F in the 100 ps fine time raster; on line 519, the correction values KI0n of FIG. 6H in the 100 ps fine time raster are impressed for the coarse pulses I0n of FIG. 6G in the 10 ns coarse time raster. The adder 508 provides the addition result without considering a carry, if any, for the selected time delay of FIG. 6J on line 533. A carry C, if any, yielded during the addition, is fed on line 534 to a circuit 402. This circuit 402 serves to ensure that upon the occurrence of a carry, a 10 ns time raster of the base frequency is skipped. This function corresponds to the T0n correction illustrated in FIG. 6K, which is made in the case of a carry. Thus, if the addition of the correction values on lines 537 and 519 yields a tens carry on line 534, this is taken into account by merely skipping a 10 ns time raster. Details of the circuits 401 and 402 will be further discussed below in conjunction with FIGS. 5 and 8.

The function of circuit 515 is as follows: Delayed is only a single process, i.e., the occurrence of a pulse leading or trailing edge (which constitutes a single process as opposed to periodical processes, such as the 10 ns base frequency time raster). The delay value is provided on line 533. Example: If the delay value is 400 ps=0.4 ns, then the pulse edge is delayed by this value. If circuit 515 is formed as a controllable delay line with taps staggered by 100 ps each, the delay value 0.4 ns would cause the tap corresponding to this value to be activated.

The circuit in FIG. 4 is used to explain in general terms how the desired pulse train of FIG. 6D is generated from the given coarse pulse intervals in the 10 ns coarse time raster and the associated correction values, taking into account the start and end values of the coarse pulses I0n of FIG. 6G in the 10 ns coarse time raster and the associated correction values. For this purpose, the coarse pulses in the 10 ns coarse time raster are related to the coarse pulse intervals which are also in the 10 ns coarse time raster. After their generation, they merely have to be time-shifted according to the addition result of the correction values for the coarse pulse intervals and the coarse pulses. This time shift is effected by means of a circuit which skips a 10 ns time raster of the base frequency upon the occurrence of a carry during addition.

FIG. 5 shows a detailed circuit for pulse generation during the coarse pulse intervals, defined by the T0n signals (FIG. 6E) on line 538, in the 10 ns coarse time raster, taking into account the associated correction values KT0n (FIG. 6F) on line 537. This circuit consists of a top part generating the pulse leading edge and a bottom part generating the pulse trailing edge. The I0nA value (FIG. 6G) for each pulse and the associated correction value KI0nA (FIG. 6H) for the pulse leading edge as well as the I0nE value (FIG. 6G) and the KI0nE value (FIG. 6H) for the pulse trailing edge are successively provided in a processor-controlled memory 501. This means that the values I01A, I01E, I02A, I02E, I03A, I03E, defining the start and the end of the pulses, and the associated correction values KI01A, KI01E, KI02A, KI02E, KI03A, KI03E are successively provided for the pulses I01, I01, I03 in the coarse time raster (FIG. 6G). Also provided for in memory 501 is a so-called start control bit (for each pulse to be generated). Although only the top part of the circuit for generating the pulse leading edge will be described below, this description applies in analogy to the bottom part of the circuit for generating the pulse trailing edge. By means of the pulse emitted on line 538 and designating the start of a coarse pulse interval, and the start control bit from memory 501 on line 517, a start control circuit 502 is caused to emit a start signal on line 520 for a connected down counter 503. Via line 518, counter 503 is loaded in response to the signal thus generated with the I0nA value for the pulse to be generated. This counter 503 is down-counted by the 100 MHz base frequency (line 521). After a 0 count has been reached, a detector circuit 504 (for the zero count), following counter 503, supplies a signal on line 522 to a shift register 509 which is incremented at the 100 MHz base frequency (line 521).

Details on the function of this shift register 509 are shown in FIG. 8.

Shift lines of the type illustrated in FIG. 8 are commercially available, for example, from Motorola under the number MC10141.

The individual outputs of the shift register 509 are designated as S1, S2, S3, etc. If a signal occurs on line 522 (FIG. 5) for example, at the start of the third time raster of the base frequency, the occurrence of this signal causes the shift register output S1 to be marked. This marking is switched at 100 MHz in the direction of the other shift register stages, as may be seen from the times represented in FIG. 7. Of the shift register stages, the circuit in FIG. 5 uses only the outputs S1 and S2. At output S1, a signal occurs after the time between the start of the respective coarse pulse interval in the 10 ns coarse time raster and the leading edge of the coarse pulse in the 10 ns coarse time raster has elapsed. This signal appears later at the output S2 of the shift register by being switched at the 100 MHz base frequency 10 ns. This fact is used for a 10 ns shift of the coarse pulse in the 10 ns coarse time raster, provided a tens carry (FIG. 6K) occurs during the formation of the sum correction value SK.

How the sum correction value SK (FIG. 6I) is formed will be described below.

On line 537, register 506 of FIG. 5 receives the KT0n correction value (FIG. 6F) for a coarse pulse interval in the 10 ns coarse time raster. At the same time, the correction value KI0nA from memory 501 is assigned to a register 507. Both registers 506 and 507 are clocked by the output line 520 of the start control 502, submitting their contents to an adder 508. This adder adds both values for forming the sum correction value SKnA/E (FIG. 6I), the result of the addition being emitted on line 539, without considering carries. Thens carries C, if any, appear on line 534.

The function of the circuit (402 in FIG. 4, part B in FIG. 5) for skipping a 10 ns time raster upon the occurrence of a tens carry will be described below.

The output S1 of the shift register 509 is connected to an AND gate 510 and the output S2 to an AND gate 511. Through an inverter 512, AND gate 510 receives an inverted transfer signal C, whereas the non-inverted signal C is fed to AND gate 511. The outputs of both AND gates 510 and 511 are connected to an OR gate 513, whose output is also connected to an AND gate 514. The 100 MHz base frequency on line 521 is fed to the second input of the AND gate 514. If there is no carry, the AND gate 510 passes the signal emitted at output S1 of the shift register 509. This signal occurs at a time which corresponds to the 10 ns coarse raster time between the start of the coarse pulse interval and the start of the coarse pulse (see FIG. 6G). If a carry occurs, the AND gate 510 is no longer conditioned and the AND gate 511 passes the signal switched from S1 to S2 after 10 ns. This leads to the desired 10 ns T0n correction (FIG. 6K) of the 100 MHz base frequency with the result that the time between the start of the coarse pulse interval and the start of the coarse pulse is 10 ns longer than that defined by the original I0nA count. The AND gate 514 merely serves to forcibly synchronize the output signals of the AND circuits 510 and 511, respectively, with the associated times of the 100 MHz base frequency.

The addition result formed on line 539 is used for the selected time delay (FIG. 6J) of the start of the signal emitted on line 534 and defining the start of the pulse in the 10 ns coarse time raster. As previously mentioned, it is also possible to use a delay line as illustrated in FIG. 9 with taps staggered by 100 ps for the programmable delay circuit 515 of FIG. 5.

FIG. 9 shows the programmable delay line 515-1 and the associated multiplex circuit 515-2 which are commercially available as a component 515. The voltage jump determining the pulse leading edge is applied to input 534 of this delay line. The delay line has a number of delay taps D1 to D99 which are each staggered by 100 ps. The multiplex circuit 515-2 serves to switch a particular delay line tap (according to the time delay selected on line 539). According to the digital value of this delay, the multiplex circuit switches the delay tap corresponding to this value to output 535. If the selected time delay is, for example, TD1A=6.7 ns=670 ps=67×100 ps, tap D67 corresponding to this delay is switched on line 535.

The circuit combination shown in FIG. 9 (delay line and multiplexer) is generally known and obtainable, for example, as SPECLDL-121 from Engineered Components Company, California, USA, and will therefore not be described in detail.

After this so-called fine delay of the pulse leading edge by the delay circuit 515, of FIG. 5 the delayed pulse is fed to a flip-flop circuit 516 on line 535. As a result, the output 536 of the flip-flop is switched on. This is equivalent to providing the leading edge for the desired pulse, for example I1 in FIG. 6D.

It has already been pointed out that the lower part of the circuit in FIG. 5 serves to generate the pulse trailing edge. The operation of this part of the circuit is identical with the upper part of the circuit for generating the pulse leading edge and, therefore, will not be repeatedly described in detail. It is obvious that the lower part of this circuit is active for the values I0nE, KI0nE defining the end of a pulse, so that finally a signal on line 537, by means of which the end of the pulse is defined, causes the output 536 of flip-flop 516 to be reset, thus completing the generation of the desired pulse (e.g., I1 in FIG. 6D).

In summary it may be said that the circuit according to the invention provides the desired pulse train In (FIG. 6D) at the output 536 of the flip-flop 516. For its generation it is assumed that there are desired pulse intervals (FIG. 6A) to which the desired pulses In (FIG. 6D) are related. On the basis of a coarse time raster (e.g., 10 ns) it is possible to convert the desired pulse intervals Tn (FIG. 6A) into coarse pulse intervals T0n (FIG. 6E) in this coarse time raster, taking into account the associated correction values KT0n (FIG. 6F).

It is also possible to convert the desired pulses In (FIG. 6D) into so-called coarse pulses I0n (FIG. 6G), again taking into account the associated correction values KI0n (FIG. 6H).

Based on these values T0n, KT0n, I0n and KI0n, it is possible to generate the desired pulses In. The time relations of the desired pulses depend on the respective application.

For testing, for example, fast memories or logic circuits, desired pulses (and desired pulse, intervals, respectively) with particular time relations dependent on the product are required.

The desired pulse train In, in conjunction with the desired pulse intervals, is defined by appropriate digital values T1, T2, T3; I1A, I1E, I2A, I2E, I3A, I3E, etc. On the basis of these values and a time raster (e.g., the 10 ns time raster based on the 100 MHz quartz oscillator base frequency), the TnG, KTnG, KT0n, I0n and KI0n values are calculated. As soon as these values are available in a processor-controlled memory, counter-controlled signals define the start of the individual coarse pulse intervals T0n in the coarse time raster (FIG. 6E) together with the associated correction values KT0n (FIG. 6F). The pulses I0n in the coarse time raster (FIG. 6G) are generated under counter control and delayed on the basis of the correction values KT0n (FIG. 6F) and KI0n (FIG. 6H) by a suitably selected delay TDnA/E (FIG. 6J). In the case of a carry, a T0n correction (FIG. 6K) is made.

For the circuit (FIGS. 5 and 7) used for this purpose it is essential that quartz accuracy is maintained for all circuit functions including the programmable fine delay 515.

Although the chosen embodiment concerns a 100 ps time resolution, it is still possible to obtain a 10 ps time resolution, using components currently available and maintaining the 100 MHz quartz oscillator base frequency.

For this purpose it would merely be necessary to predetermine the correction values KT0n and KI0n for this time resolution and to modify the programmable delay 515 in FIG. 5 to have a 10 ps resolution according to FIG. 9. Such a modification is shown in FIG. 10. The adder 508 provides the sum (without a carry) on two lines 100 and 101. Line 101 carries the time values from 10 to 90 ps and line 100 the time values exceeding 90 ps. Line 100 is connected to a multiplex circuit 102 for selecting one tap (of 99) of a delay line 103 with taps 1–99 staggered by 100 ps.

The output of the multiplex circuit 102 is connected to a group 104 of delay lines, the delay values of which are staggered by 10 ps. The outputs of these delay lines are connected to the multiplex line 105 which switches the output of one of these delay lines as a function of the control value on line 101. Thus, a delay value of altogether 140 ps is divided into 100 ps for the delay line 103 and 40 ps for the delay line group 104.

The delay lines commercially available at present and whose taps are staggered by 100 ps are, as previously mentioned, only suitable for delaying single voltage jumps and not for delaying periodical pulse rasters in the 100 MHz range. Although the accuracy of their taps is subject to larger tolerances, they can be used to advantage for fine delay purposes during pulse generation. The reasons for this are as follows:

If a pulse starts, for example, at I2AT=39.9 ns after the start of a coarse pulse interval, the error incurred by the tolerance of the fine delay line is relatively minor in relation to the ns of this value. Furthermore, it is possible to at least compensate for this error by modifying the predetermined value I2AT.

With regard to the tolerances of the fine delay line, it is pointed out that the absolute delay values increase continuously in the ascending order of the delay line taps.

In the case of the system of FIG. 3, there are tolerances of the delay lines 302 and 307, respectively, in addition to tolerances of the delay lines in circuit 305 or 309. The tolerances of the delay lines 302 and 307, respectively, shift the start of the pulse interval, to which the pulse generation is related. Such a chain of tolerances does not occur in the new system which operates with quartz accuracy, and it is only at the end of the system that a tolerance caused by delay 515 occurs.

The following is a comparison of the prior art as exemplified by the present invention as described in the present application.

For this purpose it is assumed that both the prior art and the present invention are based on a 100 MHz quartz oscillator to provide a 10 ns coarse time raster. However, it is equally conceivable that oscillators with a lower or higher frequency are used, depending upon the speed of the circuits available.

1. The Minimum Pulse Interval Length Obtainable

In the prior art, this value was limited by the circuit technology which in turn was influenced by switching the base frequency (100 MHz) at the delay line taps. Depending upon the circuit technology used, minimum desired interval times of, for example, 50 and 30 ns respectively, were needed and obtained.

In the present invention, the switching of the base frequency is eliminated, so that the minimum interval length is limited only by the speed of the circuits which is high anyhow, amounting to about 10 ns.

2. Time Resolution Of The Pulse Interval

In the prior art, this value depended on the time stagger of the delay line taps. A resolution of 1 ns already required elaborate adjustments and could not be increased arbitrarily. The resolution of the prior art is 1 to 5 ns, depending upon the circuit technology used.

In the present invention, the time resolution of the pulse intervals is not limited by the respective circuit technology employed.

The time resolution of the pulse intervals for the present invention merely based on predetermined fine time raster values for a correction adder (709 in FIG. 7). If these correction values concern a 100 ps time raster, the time resolution for the pulse intervals is 100 ps and thus exceeds by the factor 10 that of the old system.

3. Time Resolution Of The Pulses

In the prior art, the speed, in particular of the counters for a 10 ns count rate, of the available circuits did not permit a resolution exceeding 1 ns.

In the present invention, the time resolution is determined merely by the time stagger of the taps of a fine delay line following the addition correction circuit. Delay lines with a time fine stagger of 100 ps of their taps are already commercially available. The time resolution of the pulse interval for the system of the present invention is 100 ps and thus exceeds by the factor 10 that of the old system.

It is pointed out, however, that the system of the present invention, using available circuit elements, permits 50 and even 10 ps time resolutions for the pulse intervals (see FIG. 10).

4. Pulse Length

The maximum pulse length in the prior art is 2×pulse interval length minus the "waiting time" of the base frequency to be switched at the delay line (the transient time is of a magnitude of 20 to 30 ns). Thus, there is an upper limit for the pulse length of the prior art.

This does not apply, however, to the present invention, as the base frequency is not switched and the correction values for determining the pulse length may be of an arbitrary magnitude and be stored for an arbitrary length of time.

5. Accuracy

Both in the prior art and the present invention, the repetition accuracy of the pulses to be generated depends on the accuracy of the quartz oscillator. Therefore, the repetition accuracy may be said to be quartz stable. For commercially available 100 MHz quartzes, the frequency accuracy is 0.1 ppm (part per million).

The absolute accuracy of the prior art is a function of the following factors: Quartz oscillator deviations (negligible), adjustment deviations of the delay lines for switching the base frequency, accuracy of the 2-path adjustment 310 (FIG. 3), tolerance of the delay lines used to generate the pulses, and temperature curve of the entire circuit.

In the present invention, the absolute accuracy, apart from the negligible deviation of the quartz oscillator, is merely a function of the tolerance of the fine delay line 515 (FIG. 5) used to generate the pulses and of the temperature dependence of only this line (rather than of the entire circuit). This is obvious, since the 100 MHz oscillator acts directly on this delay line without interconnected circuit groups, as in the prior art.

Known analog arrangements for generating pulses with variable time relations during pulse intervals have the serious disadvantage of a so-called percentage error. In arrangements of this type an approximately linearly increasing voltage is compared with a compare voltage. At the time at which both values are equal, a pulse edge is generated. The time passing between the time at which the pulse edge is generated is subject to a percentage error which is smaller for small time values than for larger ones. This renders such arrangements highly inaccurate particularly with regard to the accuracy of high time values.

Percentage errors of this kind are eliminated in the present invention, since the time values, independently of the predetermined magnitude, are merely a function of the quartz accuracy, which is independent of these values, and of the constant tolerance of the fine delay.

It has been previously pointed out that the method according to the present invention and the arrangement for its implementation can be used in particular for testing very fast memory products and logic circuits as well as a number of additional applications, for example, sampling transmission frequencies or generating predetermined frequencies both in the lower frequency range (audio range) and the very high MHz range. For this purpose, it is essential that carrier frequencies (transmission frequencies) can be programmably switched or that audio frequencies can be switched without transients and delays.

What is claimed is:

1. Apparatus for continuously generating desired pulses during assumed successive desired pulse intervals with a very high time resolution comprising:

means for determining the time values for the duration of the desired pulse intervals and the time values related to the start of the desired pulse intervals to establish the start and the end of the desired pulses, and dividing the edges for a coarse and a fine time raster, means for dividing the determined time values into a coarse time raster and into a fine time raster, means for generating continuous, successive coarse pulse intervals in the coarse time raster together with associated coarse pulse interval correction values in the fine time raster from the desired pulse intervals to obtain the duration of the desired pulse intervals by cumulatively adding the duration of the coarse pulse interval to the associated coarse pulse interval correction value, means for generating the desired pulses in the first time raster during coarse pulse intervals in the coarse time raster, the time values for the start and the end of the coarse pulses being related to their respective associated coarse pulse interval, and each coarse pulse start and coarse pulse end, respectively being associated with a coarse pulse correction value so that by respectively adding the time value for the coarse pulse start and the coarse pulse end to the associated coarse pulse correction value, the time value, related to the start of the desired pulse interval, is respectively obtained for the start and the end of the desired pulse, means for adding the coarse pulse interval correction value to the coarse pulse correction value for the start and the end of the coarse pulse, respectively, such that a sum correction value is obtained, means for dividing the sum correction value into a first partial value associated with the fine time raster and, if necessary, into a second partial value associated with the coarse time raster, means for shifting the coarse pulse edge by the coarse time raster corresponding to the second partial value of the sum correction value, and means for using the first partial value of the sum correction value as a control value for a selected time delay for the coarse pulse edge shifted, or, in the absence of the second partial value of the sum correction value, for the unshifted coarse pulse edge.

2. The apparatus according to claim 1, wherein the coarse time raster is derived from a quartz oscillator.

3. The apparatus according to claim 2, further comprising a processor-controlled memory wherein the coarse pulse interval time values and the associated coarse pulse interval correction values are generated from desired coarse pulse interval time values in the coarse time raster and from their associated correction values in the fine time raster, which are available from memory said processor-controlled in the time sequence of their occurrence.

4. The apparatus according to claim 3 wherein the generation of the coarse pulse intervals is effected in loading a down counter with a new initial count from said processor-controlled memory, loading being effected at a time at which the down counter would have reached a zero count for the preceding count step, said down counter being count clock driven by the coarse time raster and loaded with an initial count corresponding to the duration of the desired coarse pulse interval TnG, causing a signal, designating the start of the coarse pulse interval, to be generated, and there is further provided means for delaying the down counting of the down counter by at least one count clock if an addition step yields a carry, said addition step relating to the desired coarse pulse interval correction value supplied from said processor-controlled memory for the current pulse interval, and to the addition result without a carry for the pulse interval preceding the current pulse interval, that the coarse pulse interval correction value for the current pulse interval is generated from the addition result without a carry for the current pulse interval.

5. The apparatus of claim 1 further comprising:

circuit means for generating signals designating the start of the coarse pulse intervals and the associated digital coarse pulse interval correction values, a processor-controlled memory for supplying time values respectively designating the start and the end of the coarse pulses in the coarse time raster and relating to the start of the associated coarse pulse intervals in the coarse time raster and the associated correction values in the fine time raster and a start control bit for each coarse pulse interval, a quartz oscillator for deriving a coarse time raster pulse train, start control means that upon the occurrence of a signal designating the start of a coarse pulse interval is fed the start control bit, a first down counter coupled to the start control means and a first detector coupled for generating the leading and treating edges of the desired pulse, said first down counter being respectively loaded with the selected value clocked with the coarse time raster train, and started by the start control, said first detector generating a pulse edge signal after a particular count has been reached during down counting, a first adder coupled to the start control for respectively adding the correction values, the addition result being divided into a carry, if any, and a sum value without a carry for said first adder, a shift pulse circuit for receiving the carry from said first adder causing the pulse edge signal to be shifted by a coarse time raster value corresponding to said carry, a delay circuit coupled to the shift pulse circuit for receiving the unshifted pulse edge signal or the pulse edge signal shifted in response to a carry controlled by the sum value without a carry for said first adder and serving to respectively generate the desired pulse leading and trailing edge, and a flip flop driven by the delay circuit for receiving the desired pulse leading and trailing edges and generating the desired pulse.

6. The apparatus of claim 5 wherein:

the processor-controlled memory also serves to supply the values for the duration of the desired coarse pulse intervals in the coarse time raster and the associated correction values in the fine time raster, the start of each desired coarse pulse interval coinciding with the start of the associated desired pulse interval, and there is further provided;

a second down counter coupled to the start control for generating the signals designating the start of the coarse pulse intervals in the coarse time raster, clocked by the coarse time raster pulse train, a second detector coupled to the second down counter generating a signal after a particular count has been reached during down counting, a second adder coupled to the start control circuit for adding the correction value of the current desired coarse pulse interval to the addition result without a carry for the preceding desired coarse pulse interval, the addition result being divided into a carry, and a sum value without a carry for said second adder, a second shift pulse circuit for receiving the carry from the said second adder causing the pulse edge signal to be shifted by a value corresponding to the carry from the second adder, and a delay circuit coupled to the second shift pulse circuit into which the carry of said second adder for shifting a signal S by a coarse time raster value corresponding to said carry, such that the unshifted signal S or the signal S shifted in response to a carry designates the start of a coarse pulse interval in the coarse time raster, and that the sum value without a carry for said second adder is provided as a correction value in the fine time raster for the coarse pulse interval, and feeding the output of second delay circuit to said flip flop.

7. The apparatus of claim 6 wherein the delay circuit delays the count clock for said second down counter by a count corresponding to the carry.

8. The apparatus of claim 6 wherein, each shifting circuit for shifting the pulse edge signal by the time raster value corresponding to the carry, comprises a shift register, clocked by the coarse time raster pulse train and receiving an input signal corresponding to the pulse edge signal, said shift register being made up of series-connected stages at which the pulse edge signal delayed by a coarse time raster is tapped, first and second AND gates for receiving the undelayed pulse edge signal or the pulse edge signal delayed in response to a carry, the second input of said first AND gate receives an inverted signal and the second input of said second AND gate an uninverted signal designating the carry, and an OR gate for combining the outputs of the two AND gates.

9. The apparatus of claim 8 wherein the controllable delay circuit is a delay line with taps for different delay values in the fine time raster, and there is further provided a multiplex control circuit for selecting one of said taps according to the sum value without a carry for said first adder.

10. The apparatus of claim 8 wherein the controllable delay circuit consists of series-connected first and second delay lines, each having taps for different delay values, the time stagger of the first delay line exceeding the total delay of the second delay line (104), the sum value without a carry for said first adder is divided into two control values for the two multiplex control circuits.

* * * * *